United States Patent [19]
Saito et al.

[11] Patent Number: 5,762,706
[45] Date of Patent: Jun. 9, 1998

[54] METHOD OF FORMING COMPOUND SEMICONDUCTOR DEVICE

[75] Inventors: Junji Saito; Toshihide Kikkawa; Hirosato Ochimizu, all of Kawasaki, Japan

[73] Assignee: Fujitsu Limited, Kawasaki, Japan

[21] Appl. No.: 337,829

[22] Filed: Nov. 8, 1994

[30] Foreign Application Priority Data

| Nov. 9, 1993 | [JP] | Japan | 5-302175 |
| Mar. 15, 1994 | [JP] | Japan | 6-044414 |
| May 30, 1994 | [JP] | Japan | 6-137788 |

[51] Int. Cl.⁶ .................................. C30B 23/02
[52] U.S. Cl. .............. 117/105; 117/103; 117/108; 438/265; 438/293
[58] Field of Search ............... 117/103, 105, 117/108; 437/105, 133; 438/293, 265

[56] References Cited

U.S. PATENT DOCUMENTS

| 4,636,268 | 1/1987 | Tsang | 117/103 |
| 4,960,720 | 10/1990 | Shimbo | 117/108 |
| 5,091,335 | 2/1992 | Grunthaner et al. | 117/105 |
| 5,171,399 | 12/1992 | Brennan et al. | 117/108 |
| 5,399,521 | 3/1995 | Celii et al. | 437/133 |

FOREIGN PATENT DOCUMENTS

| 62-7692 | 1/1987 | Japan | 117/103 |
| 06-137788 | 5/1994 | Japan . | |

OTHER PUBLICATIONS

Hiruma et al; Journal of Crystal Growth, V. 102; pp. 717–724.
Shimoyama et al; Institute of Applied Physics Applied Electronic Physical Properties Subcommittee Meeting Research Paper (AP922227); No. 445, pp. 15–20.
Ishikawa et al; Applied Physics; vol. 2; No. 2; pp. 102–112.

Primary Examiner—Robert Kunemund
Attorney, Agent, or Firm—Armstrong, Westerman Hattori, McLeland & Naughton

[57] ABSTRACT

The present invention includes a process of growing a compound semiconductor layer locally, after applying radical particles that do not become an etchant of a compound semiconductor layer to an insulating mask so as to terminate the surface of the insulating mask in a state that the compound semiconductor layer is covered with the insulating mask, on the surface of the compound semiconductor layer exposed from the insulating mask.

9 Claims, 17 Drawing Sheets

METHOD OF FORMING COMPOUND SEMICONDUCTOR DEVICE

BACKGROUND OF THE INVENTION

1. Field of the Invention

The present invention relates to a method of growing a compound semiconductor, a compound semiconductor growth apparatus and a method of forming a compound semiconductor device, and more particularly to a method of forming a compound semiconductor epitaxially on a compound semiconductor single crystal substrate selectively, a compound semiconductor growth apparatus and a method of manufacturing a compound semiconductor device including the epitaxial growth process.

More, the present invention relates to a compound semiconductor device and a method of measuring defect of a compound semiconductor layer.

2. Description of the Prior Art

New electronic devices and optical devices have been realized by forming an epitaxial growth layer on a single crystal semiconductor substrate and forming this epitaxial growth layer in multiple layers or in a heterostructure. In particular, a quantum effect device for confining electrons in a low dimensional structure to bring out a quantum effect of electrons and an electronic wave interference logic element utilizing the nature of an electron wave have been devised by combining micro-lithography and heteroepitaxial technology. They are called quantization function devices, and are expected to be put to practical use in the near future as a new electronic device.

As the epitaxial technology in these cases, a molecular beam epitaxy (MBE) or a metalorganic vapor phase epitaxy (MOVPE) etc. is known. These technologies are featured by a point that a super-thin film can be grown with high controllability.

In order to supply molecular beam source materials in the MBE, a structure that a metal source is held in a vacuum chamber (a crystal growth chamber) is adopted. Development of a gas source molecular beam epitaxy (GSMBE) adopting a gas introduction method in which a gaseous source containing a metalorganic compound is provided outside a vacuum chamber and the source is introduced into the vacuum chamber through a gas introduction valve has become active recently. The GSMBE is also referred to as Metalorganic MBE (MOMBE) or Chemical Beam Epitaxy (CBE).

MBE, MOVPE or GSMBE used as heteroepitaxial technology has features in a growth process on a semiconductor substrate, respectively. In particular, a fact that a mask for patterning is formed on a semiconductor substrate and a heteroepitaxial layer is grown on the substrate surface will be described as follows.

(1) MBE

Due to the fact that the growth principle of the MBE is close to physical vapor deposition, it is possible to grow a single crystal layer of GaAs or AlGaAs on a GaAs single crystal surface when a compound semiconductor layer is grown on a GaAs substrate for instance using a mask composed of $SiN_x$ applied with patterning. A pattern of a single crystal of GaAs or AlGaAs is formed at a part that is not covered with a mask.

On the other hand, a polycrystalline GaAs or AlGaAs layer is deposited on the $SiN_x$ film. The control of the thickness of the single crystal layer does not depend on the size and the configuration of a window of the mask, but is determined by the intensity of the molecular beam that reaches the mask or the surface of the single crystal layer. This is an advantageous point in the production of a microstructure.

Although the polycrystalline layer formed on the mask can be utilized as an insulating layer, it becomes necessary to remove the polycrystalline layer by a lift-off method or the like when a heterostructure or an electrode is formed in an area by the single crystal layer pattern.

(2) MOVPE

In the MOVPE, features of selective growth on the substrate also undergo a change depending on the difference whether the gas pressure in a furnace during growth is a normal pressure or a reduced pressure.

In the case of normal pressure MOVPE, a polycrystalline or amorphous film is accumulated on an insulating film such as a $SiN_x$ film used as a mask. Further, a single crystal film is grown on a single crystal plane that is not covered with the mask. However, it is known that what is called an edge effect that a growth rate on a single crystal plane changes depending on an area ratio of an area where the insulating film is formed to an area where the single crystal layer is in existence, or the growth rate in an area near the insulating film in the single crystal plane is produced.

In the case of low-pressure MOVPE, while the polycrystalline or amorphous film becomes more difficult to be accumulated on the insulating film as the pressure is reduced, the change of the growth rate and the edge effect due to the area ratio of the insulating film (a mask) to the single crystal plane become conspicuous.

The edge effect is described in the following document.

[1] Kenji HIRUMA et al., Journal of Crystal Growth 102, pp. 717–724, 1990

(3) GSMBE

In GSMBE, when GaAs is grown in a state that a mask composed of $SiN_x$ (an insulating film) applied with patterning is formed on the GaAs substrate for instance, nothing is accumulated on the mask, and neither the change of the growth rate nor the edge effect on the single crystal plane due to the area ratio of the insulating film to the single crystal plane is observed at all. This is originated in that the GSMBE is the growth by a surface reaction mechanism between the molecular beam material and the solid surface.

The virtue of selectivity of the growth by the GSMBE is very effective when a quantum functional device is produced by heteroepitaxial growth on the semiconductor substrate. Similarly to the case of the MBE, however, such a combination of the molecular beam material and the insulating film that a polycrystalline film or an amorphous film is accumulated on an insulating film is in existence.

For example, when an AlGaAs single crystal is grown selectively using a patterning mask composed of $SiN_x$, an AlGaAs polycrystalline or amorphous film is accumulated on the mask. This is because of such a reason that the metalorganic is very active and decomposition reaction is also generated even on the $SiN_x$ film and the insulating film. The AlGaAs single crystal layer or the single crystal layer having Al in the composition thereof is a very important layer in producing an electronic device of GaAs system, and the demand for technical development for growing these layers selectively is great.

In the following document, it is disclosed that an AlGaAs layer can be grown selectively without accumulating a polycrystalline or amorphous film on a $SiN_x$ patterning mask film by adding hydrogen chloride gas (Hcl) during growth of AlGaAs by MOVPE.

[2] Kenji Shimoyama, Katsuji Fujii, Yuichi Inoue and Hideki Goto, Institute of Applied Physics, Applied Electronic Physical Properties Subcommittee Meeting Research Paper (AP922227), No. 445, pp. 15–20, 1992

As a model of the duty of Hcl gas on the improvement of selectivity, it is considered that dangling bond on the $SiN_x$ film surface is terminated with Cl and the reaction between a growth species containing Al and the $SiN_x$ film is reduced.

Even when a method of adding Hcl gas during growth by MOVPE is adopted, it is impossible to completely eliminate the area ratio effect of the pattern and the edge effect described previously, and controllability of the growth rate is low in forming a pattern of a microstructure. With the area ratio effect, such a problem that it becomes more difficult to obtain an even device characteristic in one semiconductor integrated circuit is presented. Further, since the semiconductor layer is curved according to the edge effect, there are such problems that carrier travelling performance of the electronic device is deteriorated, optical confinement of an optical device becomes poorer and so on.

Further, since Hcl gas acts as etching gas of GaAs or AlGaAs, the growth rate of the semiconductor becomes more difficult to be controlled by the addition of Hcl, and an even device characteristic is difficult to obtain when an electronic device or an optical device is formed.

SUMMARY OF THE INVENTION

It is an object of the present invention to provide a method of growing a compound semiconductor and a compound semiconductor growth apparatus capable of controlling the thickness and the film quality of a compound semiconductor layer that is grown selectively (locally) with high precision and forming the compound semiconductor layer flat. Further, it is another object to provide a compound semiconductor device having good film quality and a method of forming a compound semiconductor device for forming a compound semiconductor layer with high flatness. Furthermore, it is still another object to provide a method of measuring defects of a new compound semiconductor layer.

According to the present invention, radical particles that do not become an etchant of a compound semiconductor are applied to a first compound semiconductor layer and an insulating mask before the source gas for growing a compound semiconductor on the first compound semiconductor layer that is not covered with an insulative mask is introduced, simultaneously with introduction thereof or intermittently.

With this, dangling bond on the insulative mask is terminated by means of radical particles almost without etching a first and a second compound semiconductor layers, and decomposition reaction of molecular beam source materials on the insulating film surface is controlled. Moreover, a compound semiconductor layer grown selectively is formed flat without being subject to the etching effect according to gas source molecular beam epitaxial growth.

It is possible to generate radical particles by ECR plasma, RF plasma, collision of thermal electrons or the like, and it is possible to take out radical particles thus generated in a beam form and apply these radical particles to a growth substrate in a vacuum where a free mean path is long.

The radical particles are very active in themselves, and have such a nature of exchanging electrons so as to become stable neutral particles by colliding with other particles or materials. Therefore, electrons of dangling bond are held in common or electrons are absorbed so as to achieve neutralization by the radical particles coming into contact with the dangling bond on the insulating film. On the insulating film surface where the dangling bond is terminated, even when metalorganic particles come flying or come near, electrons required for decomposition of the particles are no longer supplied, but the particles drift away again as they are without being decomposed. On the other hand, since free electrons exist on the single crystal substrate surface, the arriving metalorganic particles are decomposed, only metal atoms contribute to the growth, and organic radicals are re-evaporated and desorbed. With this, crystals are grown on the single crystal surface.

Accordingly, by supplying metalorganic materials while applying radical particles intermittently onto the single crystal substrate covered by applying patterning of the insulating film, nothing is accumulated on the insulating film, thus making growth of the single crystal at a growth rate in accordance with the strength of the supplied metalorganic material on the single crystal plane.

Further, it has been also known that a cleaning effect of the semiconductor crystal surface by means of hydrogen radicals, and, when the radical particles are hydrogen radicals, an epitaxial film of a high quality having a very low interface state is grown on the single crystal plane applied with patterning.

In particular, a large effect is obtainable in the selective growth of an epitaxial film containing active constitutive elements such as Al.

It is an object of another invention to provide a compound semiconductor device having a compound semiconductor layer of high quality containing arsenic, a method of manufacturing a compound semiconductor device for forming a compound semiconductor layer of high quality containing arsenic, and a method of measuring a defect of a compound semiconductor layer for easily judging the existence of a crystal defect that cannot be observed from the outside.

According to the present invention, there is provided a compound semiconductor device in which, when a second compound semiconductor layer containing arsenic is grown on a first compound semiconductor layer where a strain has been produced because of lattice constant mismatching, the growth of the second compound semiconductor layer is interrupted once or a plurality of times, and the first and the second compound semiconductor layers are annealed in an atmosphere containing arsenic or phosphorus during interruption.

Arsenic or phosphorus restrains gallium or indium forming a semiconductor layer containing arsenic from diffusing into a vapor phase. Further, since atoms of gallium or indium become easier to get about when energy is given by annealing, gallium or indium fills up holes produced in the compound semiconductor layer containing arsenic.

Further, when phosphorus is contained in the first compound semiconductor layer, phosphorus becomes more difficult to come off due to the energy given by annealing.

With this, the hole becomes no longer to be produced in the second compound semiconductor layer.

Further, according to another invention, by observing the uppermost layer and a desired layer thereunder in a compound semiconductor layer of a multilayer structure with an AFM, the state of a microscopic defect and composition fluctuation of the desired layer is measured indirectly. When an inclined substrate is used for instance, the defect is observed by the change of step bunching produced in respective layers.

According to still another invention, a plane inclined from a (100) plane toward a (110) plane is adopted as the main plane of the substrate forming a compound semiconductor device. Since the mobility of electrons and the steepness of composition change of a compound semiconductor layer formed on this main plane become larger as compared with a case that the plane is inclined in another direction, the characteristics of the compound semiconductor device are improved when this compound semiconductor layer is used as a carrier travelling layer.

DESCRIPTION OF THE PREFERRED EMBODIMENTS

Figure 1:
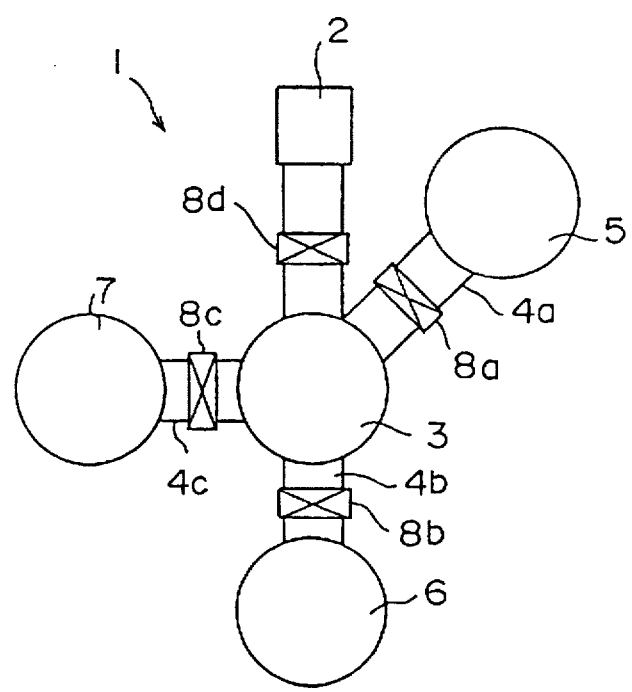
FIG. 1 is a plan view showing an outline of a compound semiconductor epitaxial selective growth apparatus according to an embodiment of the present invention.

FIG. 1 is a plan view showing a schematic structure of a compound semiconductor selective growth apparatus according to an embodiment of the present invention.

A compound semiconductor selective growth apparatus 1 has a load-lock chamber 2 for putting in and out a wafer, a wafer exchange chamber 3 for relaying the wafer, a GSMBE unit 5 connected to the wafer exchange chamber 3 through a vacuum tunnel 4a, an optical oxide film forming chamber 6 connected to the wafer exchange chamber 3 through a vacuum tunnel 4b, and an electron beam application chamber 7 connected to the wafer exchange chamber 3 through a vacuum tunnel 4c. Besides, reference numerals 8a to 8d in the figure represent shutters.

Figure 2A:
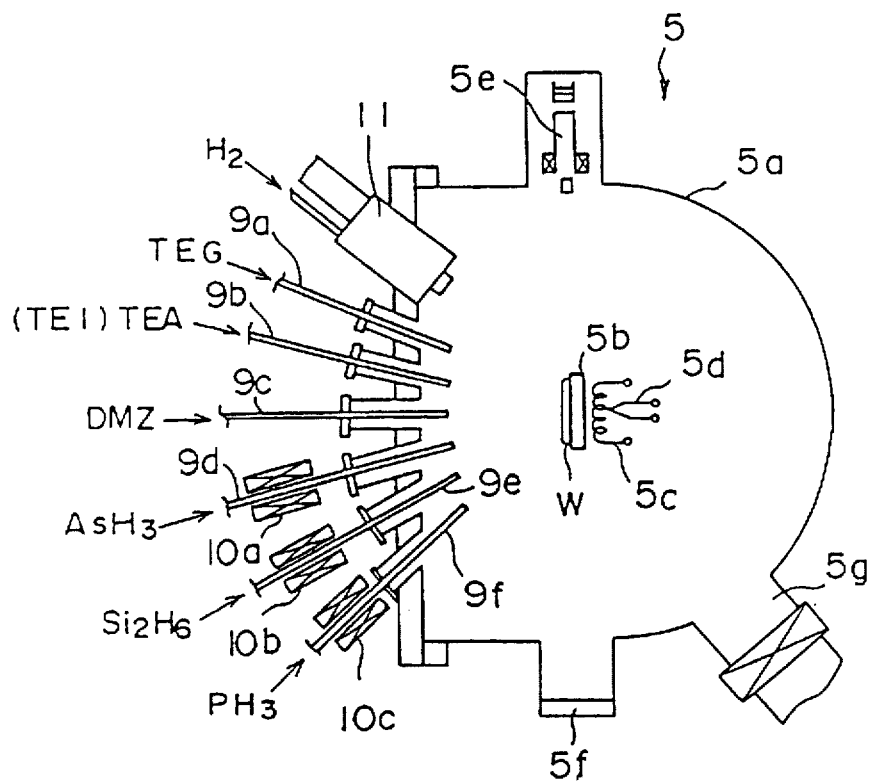
FIG. 2A is a sectional view showing a crystal growth chamber of a compound semiconductor epitaxial growth apparatus according to an embodiment of the present invention.

In a crystal growth chamber 5a of the GSMBE unit 5, a wafer supporting base 5b for placing a wafer w thereon, a heater 5c for heating the wafer supporting base 5b, a thermocouple 5d for measuring the temperature of the heater 5c, an electron gun 5e for applying electrons to the wafer surface, an RHEED 5f for receiving electrons reflected from the wafer w, and an exhaust system 5g for reducing the pressure in the crystal growth chamber 5a are provided as shown in FIG. 2A. Further, a plurality of molecular beam source nozzles 9a to 9c for introducing metalorganic gas, a molecular beam source nozzle 9d for introducing inorganic gas decomposed by a thermal decomposition cell 10a, and molecular beam source nozzles 9e and 9f for introducing impurity gas decomposed by thermal decomposition cells 10b and 10c are fitted to the crystal growth chamber 5a. Further, the points of these molecular beam source nozzles are directed toward the wafer w, and freely opening and closing molecular beam source shutters (not illustrated) are arranged in front of the points of these molecular beam source nozzles 9a to 9f. Furthermore, an ECR plasma generating source 11 for generating radicals is fitted to the crystal growth chamber 5a.

Figure 2B:
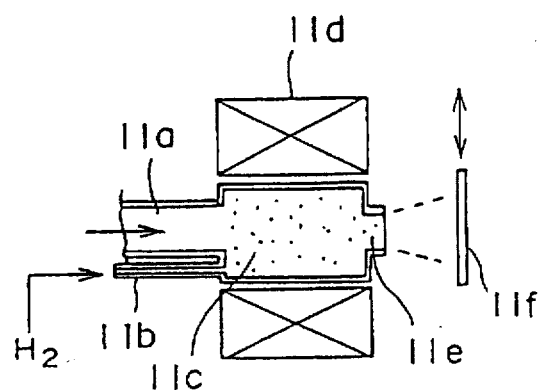
FIG. 2B is a sectional view showing a radical particle generating source provided inside the crystal growth chamber.

As shown in FIG. 2B, the ECR plasma generating source 11 has a plasma chamber 11c to which a microwave introduction pipe 11a and a gas introduction pipe 11b are connected, a magnet coil 11d surrounding the plasma chamber 11c and a gas discharge port 11e for discharging gas from the plasma chamber 11c toward the wafer w, and a shutter 11f is arranged at the gas discharge port 11e.

The GSMBE unit 5 is fitted with a mass spectrometer, an Auger spectro-chemical analyzer, a nude ion gauge or the like not illustrated other than the above.

The electron beam application chamber 7 described previously has an electron beam column (not illustrated) having a differential discharge structure for applying the electron beam to the wafer w, and also has a structure that gas such as chlorine and oxygen can be introduced into an EB drawing chamber.

The photooxidation film forming chamber described previously has a structure capable of introducing oxygen into a chamber where a wafer is placed, and forms a photooxidation film on the surface of a compound semiconductor layer such as GaAs by applying light in an oxygen atmosphere in the chamber.

Next, embodiments of the process of manufacturing an electronic device and an optical device using the compound semiconductor selective growth apparatus 1 described previously will be described.

(The first embodiment)

The present embodiment shows a method of manufacturing a high performance power FET having a heteroepitaxial structure by making the most use of selective growth technique of the present invention.

The manufacturing process of a power FET will be described hereunder with reference to a flow chart shown in FIG. 3 and sectional views shown in FIG. 4A to FIG. 4H.

A semi-insulating GaAs substrate (a wafer) 21 having a (100) plane is used as a compound semiconductor substrate on which a power FET is formed.

First, the GaAs substrate 21 is conveyed into the GSMBE unit 5 through the load-lock chamber 2 and the wafer exchange chamber 3. Then, the GaAs substrate 21 is mounted on the wafer supporting base 5b in the crystal growth chamber 5a of the GSMBE unit 5, thus entering into an MBE growth process ($S_1$ in FIG. 3).

As gas source materials for epitaxial growth introduced into the crystal growth chamber 5a, triethylgallium (TEG: $Ga(C_2H_5)_3$) and triethylaluminum (TEA: $Al(C_2H_5)_3$) are introduced into the crystal growth chamber 5a through the first and the second molecular beam source nozzles 9a and 9b, and arsine ($AsH_3$) is introduced into the crystal growth chamber 5a through a fourth molecular beam source nozzle 9d attached with a thermal decomposition cell 10a. Further, disilane ($Si_2H_6$) is introduced into the crystal growth chamber 5a through a fifth molecular beam source nozzle 9e attached with a thermal decomposition cell 10b as an n-type dopant.

Respective flow rates of these gas sources are adjusted independently by mass flow controllers not illustrated so as to be applied toward the GaAs substrate 21 in the crystal growth chamber 5a.

However, the arsine gas is decomposed in the thermal decomposition cell 10a at a high temperature (900° C.) and applied onto the substrate surface as As and $H_2$. The disilane gas is decomposed into Si and $H_2$ in the thermal decomposition cell 10b and applied onto the substrate surface similarly to the above.

Figure 4A:
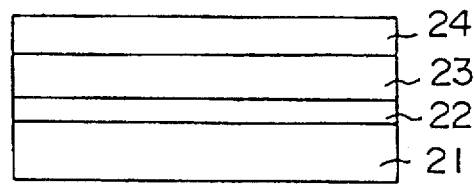
FIG. 4A to FIG. 4H are sectional views showing a manufacturing process of an electronic device according to the first embodiment of the present invention.

Then, after the semi-insulating GaAs substrate 21 is introduced into the crystal growth chamber, the shutters of the molecular beam source nozzles are opened and closed in the following sequence, thereby to form a compound semiconductor layer such as shown in FIG. 4A.

First, the shutter of the fourth molecular beam source nozzle 9d is opened, and the GaAs substrate 21 is heated at a temperature of approximately 600° C. or higher by means of the heater 5c while applying arsine to the surface of the GaAs substrate 21 at a flow rate of 5 sccm. With this, a natural oxide film on the surface of the GaAs substrate 21 is removed. Then, the substrate temperature is lowered down to the growth temperature of 550° C. and this temperature is maintained.

Thereafter, the shutter of the molecular beam source nozzle 9a for introducing TEG is opened, thereby to start growth of i-GaAs on the GaAs substrate 21. The flow rate of TEG is set to 1.6 sccm.

After an i-GaAs layer 22 is grown on the GaAs substrate 21 in a thickness of approximately 4,000 Å, the shutter of the second molecular beam source nozzle 9b is opened so as to apply TEA gas toward the GaAs substrate 21, thereby to start growth of AlGaAs so as to grow an i-AlGaAs layer 23 in a thickness of approximately 1,000 Å. The flow rate of the TEA gas is set to 0.24 sccm.

Thereafter, the shutter of the molecular beam source nozzle 9b for introducing TEA is closed simultaneously with opening the shutter of the molecular beam source nozzle 9d for introducing disilane. With this, an n-GaAs layer 24 doped with Si is grown on the i-AlGaAs layer 23 in a thickness of 0.2 μm. The impurity concentration of the n-GaAs layer 24 is set to $1.5 \times 10^{17} cm^{-3}$.

Thereafter, the shutters of the molecular beam source nozzles other than the molecular beam source nozzle 9d for introducing arsine are closed, and then the substrate temperature is lowered gradually. The shutter of the molecular beam source nozzle 9d for introducing arsine is closed when the substrate temperature becomes 300° C. or lower. With this, the first growth of the compound semiconductor layer comes to an end.

Figure 3:
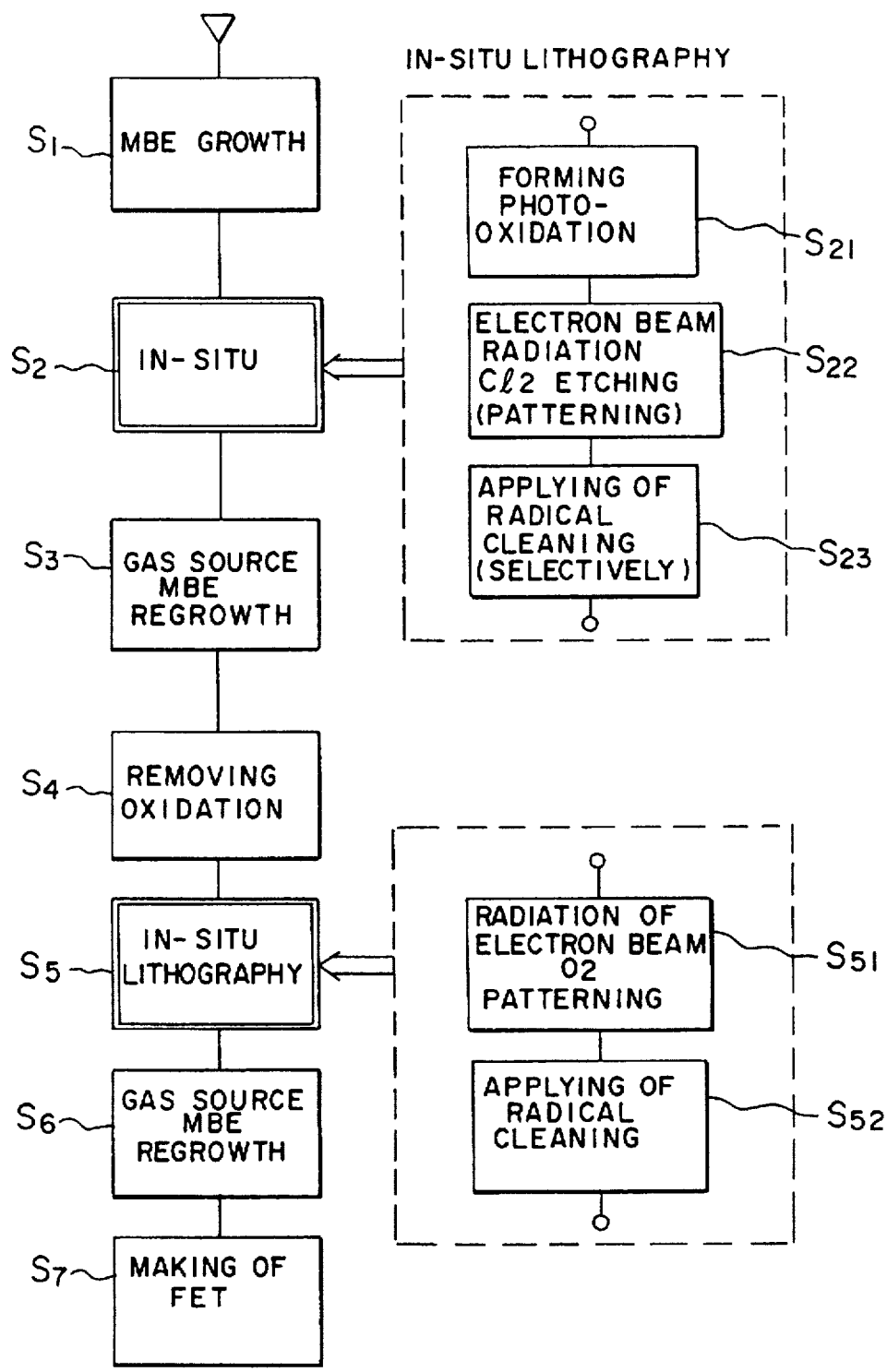
FIG. 3 is a flow chart showing a manufacturing process of an electronic device according to a first embodiment of the present invention.

Next, an IN-SITU lithography process such as shown in a step $S_2$ in FIG. 3 is started.

First, the GaAs substrate 21 is taken out of the crystal growth chamber 5a of the GSMBE unit 5, and is conveyed into the photooxidation film forming chamber 6 through the vacuum tunnels 4a and 4b and the wafer exchange chamber 3.

Figure 4B:
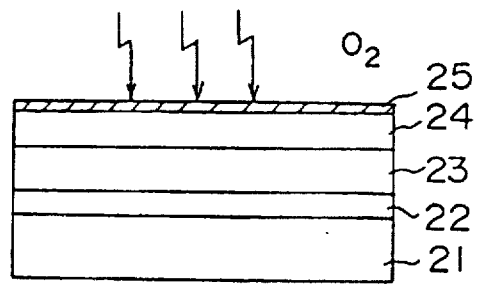

Then, as shown in FIG. 4B, an oxygen atmosphere having a pressure within a range of several Torr to several ten Torr is formed inside the photooxidation film forming chamber 6, and a GaAs oxide film 25 is formed on the surface of the n-GaAs layer 24 in a thickness of 1 to 2 nm by applying light to the surface of the n-GaAs layer 24 on the GaAs substrate 21 (a step $S_{21}$ in FIG. 3). In this case, a Xenon lamp is used as the light source.

Figure 4C:
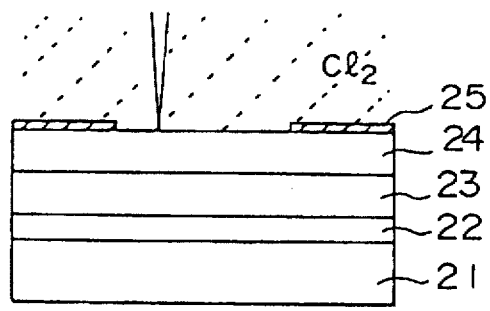

Thereafter, the GaAs substrate 21 is taken out of the photooxidation film forming chamber 6 and introduced into the electron beam application chamber 7 through the vacuum tunnels 4b and 4c and the wafer exchange chamber 3. In the electron beam application chamber 7, electron beams taken out of an electron beam column having a differential discharge structure not illustrated is applied onto the GaAs oxide film 25 located in a channel region of a power FET (a region other than an ohmic electrode forming region) while applying chlorine gas in the direction toward the GaAs substrate 21 for etching (a step $S_{22}$ in FIG. 3). As a result, as shown in FIG. 4C, the GaAs oxide film 25 applied with the electron beams is removed, and the n-GaAs layer 24 is exposed therefrom. With this, the GaAs oxide film 25 is formed into a pattern having an opening portion in the channel region.

Besides, since excessive etching is produced if the chlorine gas is supplied excessively, the period of supply time is shortened.

Next, the GaAs substrate 21 is taken out of the electron beam application chamber 7, and is introduced again in the crystal growth chamber 5a of the GSMBE unit 5 through the vacuum tunnels 4c and 4a and the wafer exchange chamber 3. Hydrogen gas is introduced into the ECR plasma generating source 11 of the GSMBE unit 5, and hydrogen radicals are released into the crystal growth chamber 5a.

Figure 4D:
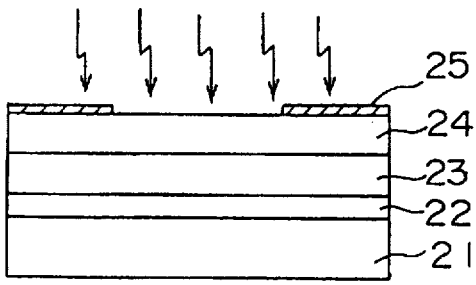

In the crystal growth chamber 5a, first, as shown in a step $S_{23}$ in FIG. 3 and in FIG. 4D, hydrogen radicals taken out of the ECR plasma generating source 11 are applied onto the n-GaAs layer 24 and the GaAs oxide film 25 on the GaAs substrate 21. At this time, the pressure in the crystal growth chamber 5a was set to the level of $10^{-4}$ Torr, and the introduction flow rate of hydrogen into the ECR plasma generating source 11 was set to 2 sccm. In such a manner, the surface of the single crystal n-GaAs layer 24 is applied with cleaning, and the dangling bond on the surface of the GaAs oxide film 25 is also terminated with hydrogen. These hydrogen radicals are supplied while taking sufficient time.

Next, after the application of hydrogen radicals is stopped, an MBE regrowth process such as shown in a step $S_3$ in FIG. 3 is started.

Figure 4E:
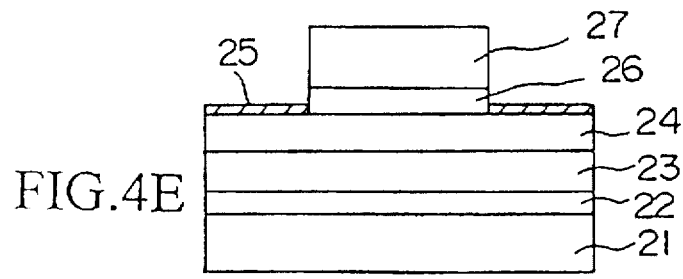

First, the substrate temperature is raised to 550° C. while applying arsine from the fourth molecular beam source nozzle 9d toward the GaAs substrate 21, and this temperature is maintained. Then, the shutters of the molecular beam source nozzles 9a, 9b and 9e for introducing TEG, TEA and disilane are opened at the same time, thereby to grow an n⁻-AlGaAs layer 26 in a thickness of 500 Å on the n-GaAs layer 24 that is not covered with the GaAs oxide film 25 as shown in FIG. 4E. The silicon concentration in the n⁻-AlGaAs layer 26 is set to $5 \times 10^{16}$ cm$^{-3}$. Thereafter, only the shutters of the molecular beam source nozzles 9b and 9e for introducing TEA and disilane are closed, and an i-GaAs layer 27 is grown in a thickness of 1,500 Å on the n⁻-AlGaAs layer 26 as shown in FIG. 4E.

When the n⁻-AlGaAs layer 26 and the i-GaAs layer 27 thus grown selectively by GSMBE with the GaAs oxide film 25 as a mask are observed, it has been found that neither an edge effect nor an insulating film-semiconductor layer area ratio effect has been generated. Further, the i-GaAs layer 27 is in existence in the channel region as a pattern.

Figure 4F:
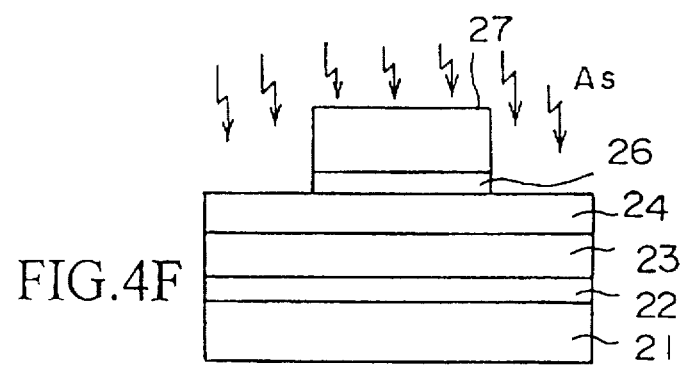

Next, by heating to raise the substrate temperature to 600° C. or higher while keeping only the shutter of the molecular beam source nozzle 9d for introducing arsine opened, the GaAs oxide film 25 that has been used as a mask is removed as shown in FIG. 4F and a step $S_4$ in FIG. 3.

Next, the second IN-SITU lithography process such as shown in a step $S_5$ in FIG. 3 is started.

First, the GaAs substrate 21 is introduced again into the electron beam application chamber 7. In the electron beam application chamber 7, the electron beam is drawn only on the top surface of the selectively grown i-GaAs layer 27 while applying $O_2$ gas in lieu of $Cl_2$ gas described previously, thereby to form a GaAs oxide film 28 on the surface thereof.

Then the GaAs substrate 21 is introduced again into the crystal growth chamber 5a of the GSMBE unit 5, and hydrogen radicals are applied to a GaAs oxide film 28 and the i-GaAs layer 24 in the crystal growth chamber 5a so as to apply cleaning to the i-GaAs layer 24, and the surface of the GaAs oxide film 28 is terminated with hydrogen (a step $S_{52}$ in FIG. 3).

Figure 4G:
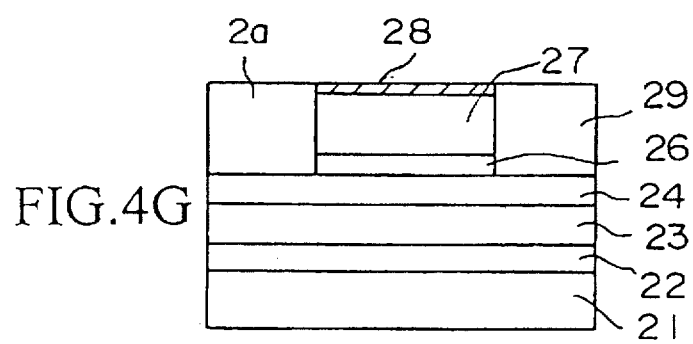

Next, in the same GSMBE unit 5, the shutters of the molecular beam source nozzles 9a, 9d and 9e for introducing TEG, arsine and disilane are opened, and an n⁺-GaAs layer 29 is grown selectively only in the ohmic region with the GaAs oxide film 28 as a mask as shown in FIG. 4G (a step $S_6$ in FIG. 3). The silicon concentration in the n⁺-GaAs layer 29 is set to $2 \times 10^{18}$ cm$^{-3}$, and the thickness thereof is made to show almost the same height as the GaAs oxide film 28.

Thereafter, the GaAs oxide film 28 that have been used as a mask is removed in the same manner as the GaAs oxide film 25 in the first layer.

Next, the GaAs substrate 21 is taken outside of the GSMBE unit 5 through the vacuum tunnel 4a, the wafer exchange chamber 3 and the load-lock chamber 2.

Figure 4H:
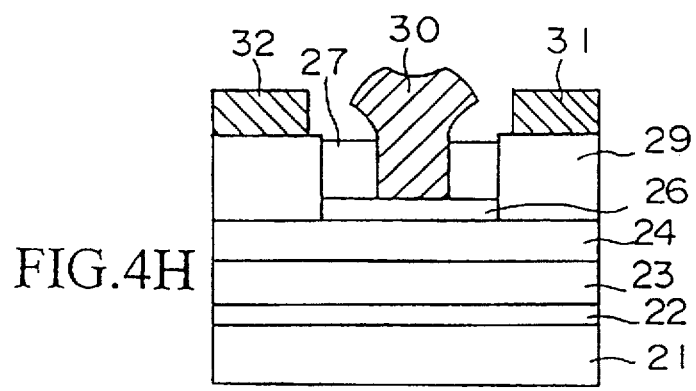

Then, as shown in FIG. 4H, the i-GaAs layer 27 in the first selective growth layer portion is applied with patterning so as to form an opening portion, a buried gate electrode 30 is formed therein, and a source electrode 31 and a drain electrode 32 are also formed on the top surface of the n⁺-GaAs layer 29 in the second selective growth layer portion, thereby to complete a power FET (a step $S_7$ in FIG. 3).

Since the ohmic contact resistance of the source and drain electrode portion is reduced in the FET structure thus produced, excellent FET characteristics have been realized.

Now, since cleaning is applied to the surface of the semiconductor layer using hydrogen radical particles before growing the compound semiconductor selectively in the process described above, an epitaxial layer of high quality having a very small interface state is grown on a single crystal plane.

Further, according to the hydrogen radicals, since the dangling bond on the GaAs oxide films (insulating films) 25 and 28 is terminated, the decomposition reaction of the molecular beam source materials on the surfaces of the insulating films 25 and 28 is controlled. In this case, the etching rate of hydrogen radicals for GaAs and AlGaAs is very low, and it is not required to make the control of these hydrogen radicals minutely. Since the film thickness of the GaAs layers 24 and 27 that are not covered with the GaAs layers 25 and 28 is formed with high controllability with the above, unevenness of device characteristics is eliminated.

The radical particles are very active in themselves, and have a nature of going to become stable neutral particles by exchanging electrons by colliding with other particles or substances. Therefore, electrons of the dangling bond are held in common or electrons are absorbed thereby to achieve neutralization by the radical particles approaching to the dangling bond on the insulating film. Since electrons required for particle decomposition are no longer supplied onto the insulating film surface where the dangling bond is terminated even when metalorganic particles come flying or get near, these particles are desorbed again as they are without being decomposed. On the other hand, on the single crystal substrate surface, arriving metalorganic particles are decomposed since free electrons are in existence, only metal atoms contribute to the growth, and organic radicals are evaporated and desorbed again, thereby to perform crystal growth.

Thus, radical particles may also be applied intermittently onto a single crystal substrate applied with patterning with the insulating film. In this case, nothing is accumulated on the insulating film by supplying a metalorganic material, but a single crystal is grown at a growth rate in accordance with the strength of the metalorganic material supplied onto the single crystal plane only.

Further, when GaAs or AlGaAs is grown selectively with the GaAs oxide films 25 and 28 as a mask, it does not occur that an edge effect is produced in GaAs or AlGaAs and the film thickness depends on the area of the mask, but the GaAs layer that becomes a channel region is formed flat. With this, the travelling performance of the carrier is improved in an FET, and excellent transistor characteristics are obtainable.

(The second embodiment)

The present embodiment shows a method of manufacturing a semiconductor laser having a DH structure by using the most of selective growth technique of the present invention on an InP substrate.

A manufacturing process of a semiconductor laser will be described hereinafter with reference to sectional views shown in FIGS. 5A to 5H.

An n-InP substrate (a wafer) having a (100) plane is used as a compound semiconductor substrate on which a semiconductor laser is formed.

First, an n-InP substrate 41 is conveyed into the GSMBE unit 5 through the load-lock chamber 2 and the wafer exchange chamber 3 shown in FIG. 1. Then, the n-InP substrate 41 is placed on the wafer supporting base 5b in the crystal growth chamber 5a of the GSMBE unit 5.

As gas source materials for epitaxial growth that are introduced into the crystal growth chamber 5a, triethylgallium (TEG: Ga(C$_2$H$_5$)$_3$) and triethylindium (TEI: In(C$_2$H$_5$)$_3$) are introduced into the crystal growth chamber 5a through the first and the second molecular beam source nozzles 9a and 9b, and arsine (AsH$_3$) and phosphine (PH$_3$) are introduced into the crystal growth chamber 5a through the fourth and the sixth molecular beam source nozzles 9d and 9f attached with thermal decomposition cells 10a and 10c. Further, disilane (Si$_2$H$_6$) is introduced into the crystal growth chamber 5a through the fifth molecular beam source nozzle 9e attached with a thermal decomposition cell 10b as an n-type dopant, and dimethylzinc (DMZ: Zn(CH$_3$)$_2$) is introduced into the crystal growth chamber 5a through the third molecular beam source nozzle 9c as a p-type dopant.

These gas sources are regulated with respect to the flow rate independently by means of mass flow controllers not illustrated, respectively, and are arranged to be applied toward the n-InP substrate 41 in the crystal growth chamber 5a.

However, arsine gas and phosphine are applied to the substrate surface as As$_2$ and H$_2$ after being decomposed in the thermal decomposition cells at a high temperature (900° C.). The disilane gas is also decomposed into Si and H$_2$ similarly to the above in the thermal decomposition cell and applied to the substrate surface.

Figure 5A:
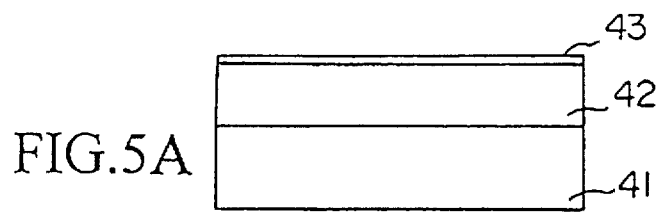
FIG. 5A to FIG. 5H are sectional views showing a manufacturing process of a semiconductor laser according to a second embodiment of the present invention.

Then, after the n-InP substrate 41 is introduced into the crystal growth chamber 5a, the shutters of the molecular beam source nozzles are opened and closed in the following sequence so as to form a compound semiconductor layer such as shown in FIG. 5A.

First, after the n-InP substrate 41 is introduced into the crystal growth chamber 5a, the substrate is heated to approximately 530° C. or higher while applying arsenic (As) to the n-InP substrate surface. After the natural oxide film on the surface of the n-InP substrate 41 is removed, the substrate temperature is lowered down to the growth temperature at 480° C. and this temperature is maintained. Then, the shutters of respective molecular beam source nozzles 9b, 9f and 9e for introducing TEI, phosphine and disilane are opened so as to start growth of n-InP, and an n-InP layer 42 is grown in a thickness of approximately 3,000 Å on the n-InP substrate 41.

Thereafter, the shutters of the molecular beam source nozzle 9d for arsine and the molecular beam source nozzle 9b for TEA are opened after the shutters of the molecular beam source nozzles 9b, 9f and 9e for TEI, phosphine and disilane are closed, thereby to grow a GaAs layer 43 composed of several atomic layers.

Then, the shutters of molecular beam source nozzles other than the molecular beam source nozzle 9d for introducing arsine are closed, and the substrate temperature is lowered gradually in succession. When the substrate temperature reaches 300° C. or lower, the molecular beam source shutter for arsine is closed. With this, the first growth of the compound semiconductor layer is completed.

Figure 5B:
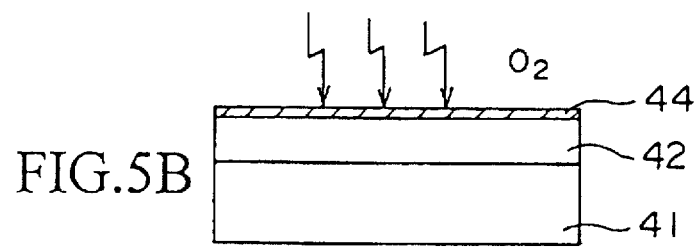

Next, the n-InP substrate 41 is taken out of the GSMBE unit 5, and conveyed into the photooxidation film forming chamber 6 through the vacuum tunnels 4a and 4b and the wafer exchange chamber 3. Then, as shown in FIG. 5B, the inside of the photooxidation film forming chamber 6 is formed into an oxygen atmosphere having a pressure within a range of several Torr to several ten Torr, and light is applied to the surface of the GaAs layer 43 composed of several atomic layers on the n-InP substrate 41 in the oxygen atmosphere so as to oxidize it, thereby to form a GaAs oxide film 44. In this case, a Xenon lamp is used as the light source.

Figure 5C:
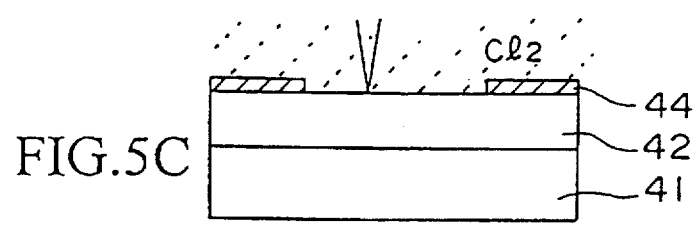

Next, the n-InP substrate 41 is taken out of the photooxidation film forming chamber 6, and moved to the electron beam application chamber 7 through the vacuum tunnels 4b and 4c and the wafer exchange chamber 3. In the electron beam application chamber 7, electron beams are applied to the GaAs oxide film 44 located in a semiconductor laser waveguide region while applying chlorine (Cl$_2$) gas toward the n-InP substrate 41 as shown in FIG. 5C. The GaAs oxide film 44 applied with electron beams is removed, and the top surface of the n-InP layer 41 is exposed therefrom.

Next, the n-InP substrate 41 is taken out of the electron beam application chamber 7, and introduced again into the GSMBE unit 5 through the vacuum tunnels 4c and 4a and the wafer exchange chamber 3.

Figure 5D:
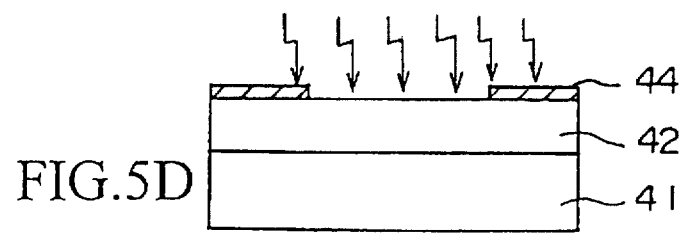

In the crystal growth chamber 5a of the GSMBE unit 5, hydrogen radicals taken out of the ECR plasma generating source 11 are applied first to the n-InP layer 42 and the GaAs oxide film 44 on the n-InP substrate 41 as shown in FIG. 5D.

At this time, the pressure in the growth chamber was set to the level of 10$^{-4}$ Torr, and the introduction flow rate of hydrogen to the ECR plasma generating source 11 was set to 2 sccm. In such a manner, the dangling bond on the surface of the GaAs oxide film 44 is terminated with hydrogen, and cleaning is also applied to the surface of the single crystal n-InP layer 42. Since the surface of the n-InP layer 42 is not etched deeply by the hydrogen radicals, it is not required to control the introduction quantity of hydrogen radicals minutely.

Figure 5E:
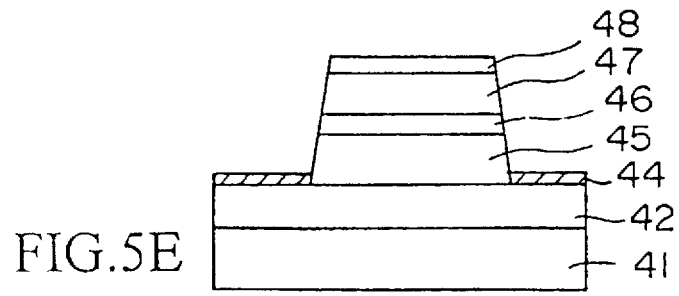

Next, the second crystal growth is performed after stopping application of hydrogen radicals, thereby to form a layer structure such as shown in FIG. 5E.

First, the substrate temperature is raised to 550° C. while applying arsine toward the n-InP substrate 41 from the fourth molecular beam source nozzle 9d, and this temperature is maintained. Then, the shutters of the molecular beam source nozzles 9b, 9e and 9f for introducing TEI, phosphine and disilane are opened at the same time so as to grow an n-InP cladding layer 45 in a thickness of 5,000 Å on the n-InP layer 42 that is not covered with the GaAs oxide film 44. The impurity concentration of silicon in the n-InP cladding layer 45 is set to 5×10$^{17}$cm$^{-3}$.

Thereafter, the shutters of the molecular beam source nozzles 9e and 9f for introducing disilane and phosphine are closed, and then the shutters of the molecular beam source nozzles 9a and 9d for introducing TEG and arsine are opened, thereby to grow an InGaAs active layer 46 on the n-InP cladding layer 45. After the InGaAs active layer 46 has been grown, the shutters of the molecular beam source nozzles 9a and 9d for TEG and arsine are closed.

Then, the shutters of the molecular beam source nozzles 9c and 9f for introducing DMZ and phosphine are opened so as to grow a p-InP cladding layer 47 in a thickness of 5,000 Å. The impurity concentration of silicon at this time is 5×10$^{17}$cm$^{-3}$. Furthermore, the shutter of the electron beam source nozzle 9f for phosphine is closed and the shutters of the electron beam source nozzles 9a and 9d for TEG and arsine are opened, thereby to form a p-InGaAs cap layer 48. With the above, neither an edge effect nor an insulating film-semiconductor area ratio effect is produced on the n-InP cladding layer 45, the InGaAs active layer 46, the p-InP cladding layer 47 and the p-InGaAs cap layer 48 that are grown selectively along the waveguide region with the GaAs oxide film 44 as a mask.

Figure 5F:
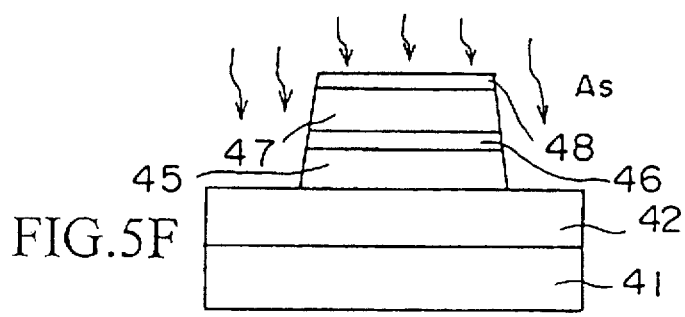

Next, the substrate is heated to 600° C. or higher while keeping only the shutter of the molecular beam source nozzle 9d for introducing arsine as it is opened, thereby to remove the GaAs oxide film 44 that has been used as a mask as shown in FIG. 5F.

Then, in order to form an oxide film on the uppermost surface of the p-InGaAs cap layer 48 grown selectively, the n-InP substrate 41 is introduced into the electron beam application chamber 7 again. In the electron beam application chamber 7, electron beams are drawn only on the top surface of the p-InGaAs cap layer 48 grown selectively while applying $O_2$ gas in lieu of $Cl_2$ gas described above, thereby to form an InGaAs oxide film 49 on the surface thereof.

Next, the n-InP substrate 41 is introduced again into the growth chamber 5a of the GSMBE unit 5, and hydrogen radicals are applied to the InGaAs oxide film 49 and the n-InP layer 42 in the growth chamber 5a. With this, cleaning is applied to the n-InP layer 42 on both sides of the waveguide region and the dangling bond on the surface of the InGaAs oxide film 49 is terminated with hydrogen at the same time.

Thereafter, the shutters of the electron beam source nozzles for TEI and phosphine are opened so as to grow i-InP only on the n-InP layer 42 on both sides of the n-InP cladding layer 45. With this, an i-InP high resistance current constriction layer 50 having almost the same height as the p-InGaAs cap layer 48 is formed. No edge effect is generated in this growth process, but the i-InP high resistance current constriction layer 50 is formed flat.

Figure 5G:
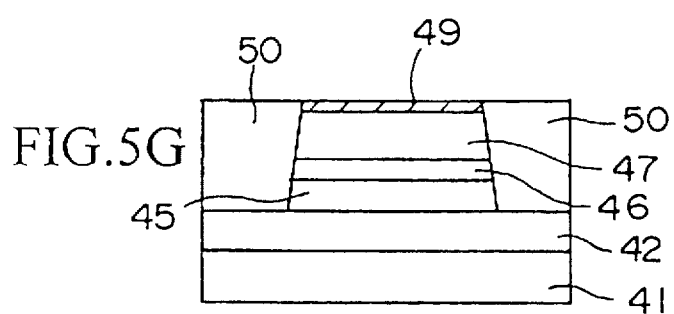

Thereafter, as shown in FIG. 5G, the shutters of the electron beam source nozzles 9b and 9f for TEI and phosphine are closed, and the InGaAs oxide film 49 that has been used as a mask is removed by heating it to 600° C. in an arsine atmosphere.

Figure 5H:
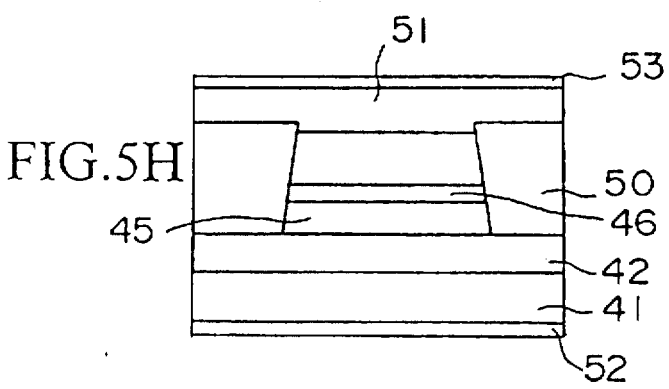

Then, the shutters of the electron beam source nozzles 9b, 9c and 9f for TEI, DMZ and phosphine are opened so as to form a $p^+$-InP layer 51 such as shown in FIG. 5H in a thickness of 3,000 Å on the p-InGaAs cap layer 48 and the i-InP high resistance current constriction layer 50.

Next, the n-InP substrate 41 is taken outside of the GSMBE unit 5 through the vacuum tunnel 4a, the wafer exchange chamber 3 and the load-lock chamber 2.

Thereafter, an n-electrode 52 is formed on the under surface of the n-InP substrate 41, and a p-electrode 53 is formed on the $p^+$-InP layer 51, thereby to complete a DH type semiconductor laser.

Since the n-InP cladding layer 45, the InGaAs active layer 46 and the p-InP cladding layer 47 are formed flat in the semiconductor laser thus produced, it does not happen that the InGaAs active layer 46 is bent, thus deteriorating optical confinement. Moreover, since the interface states produced on both sides of the InGaAs active layer 46 and the cladding layers 45 and 47 grown selectively are in the almost negligible degree, the leak current is never increased, thus making it possible to obtain characteristics that the threshold current is small and the luminous efficiency is high.

Figure 6A:
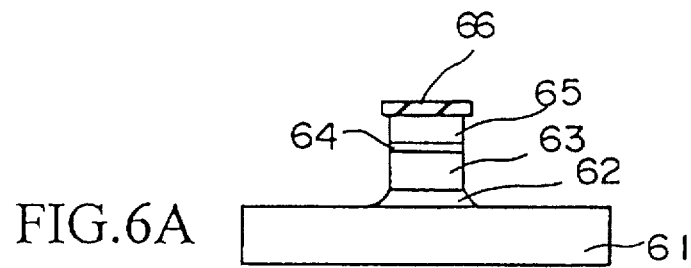
FIG. 6A to FIG. 6C are sectional views showing a typical manufacturing process of a conventional semiconductor laser.
Figure 6B:
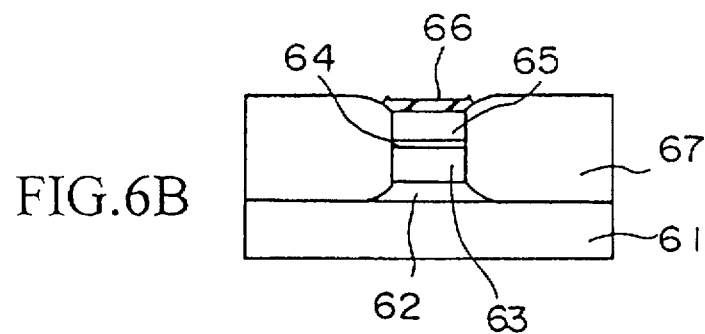
Figure 6C:
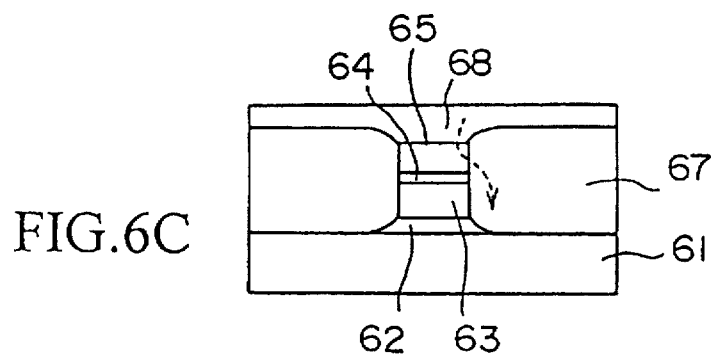

As against the above, in the process that has been used already, as shown in FIG. 6A, after an n-InP cladding layer 62, an InGaAs active layer 63, a p-InP cladding layer 64 and a p-InGaAs cap layer 65 are formed on an n-InP substrate 61, a $SiO_2$ mask 66 is formed along the waveguide region, and from the p-InGaAs cap layer 65 to the n-InP cladding layer 62 on both sides of the $SiO_2$ mask 66 are removed by etching. Thereafter, current constriction layers (or pnp buried layers) 67 are formed on both sides of the waveguide region as shown in FIG. 6B, and a $p^+$-InP contact layer 68 is formed as shown in FIG. 6C.

According to such a conventional manufacturing process, luminescent centers are formed on the side of the active layer 63 and on the sides of the cladding layers 62 and 64 by etching at time of patterning of the semiconductor layer, and the luminous efficiency is lowered or the leak current is increased. With this, there has been a problem that the threshold current is increased and the characteristics are deteriorated. As shown with a dashed line in FIG. 6C, the leak current passes from the p-InGaAs cap layer 65 to the buried layers (or the current constriction layers) 67 on both sides thereof.

Further, since the etching rate on InGaAs or InP by hydrogen radicals is very low when InP or InGaAs is grown selectively in the present embodiment, the thickness of these compound semiconductor layers is controlled with high precision. Further, by supplying a metalorganic material onto a single crystal layer applied with patterning while applying radical particles intermittently using a GaAs oxide film or an InGaAs oxide film as a mask, nothing is accumulated on the insulating film, but the single crystal is grown flat at a growth rate in accordance with the strength of the metalorganic material supplied only onto the single crystal plane. With this, the control of the film thickness of the device becomes easier and the device characteristics are uniformalized.

(The third embodiment)

The selective growth of a compound semiconductor using radical particles has been utilized for the production of a power FET in the first embodiment, but the feature of the present invention is optimum for producing such a quantization function element that a quantum effect or a nature of an electron wave is brought out by combining with forming technique of a micropattern using EB drawing technique.

Gas source MBE has been used as crystal growth technique in the first and second embodiments, but MOVPE for performing growth in a vacuum vessel is also possible as another example. Further, as to the semiconductor growth chamber, it is not required to limit the structure of the apparatus as far as the substrate can be conveyed to another processing chamber through vacuum tunnels. However, the growth source material is required to be a metalorganic compound.

The radical particles may be generated not only by the ECR plasma, but also by the RF plasma or collision by thermal electrons, and it is possible to take out radical particles thus generated in a beam form and apply it to the growth substrate in a vacuum where the mean free path is long.

Further, radical particles may be applied at the same time in the midst of growing selectively a compound semiconductor such as GaAs, InGaAs and AlGaAs, and the growth of the compound semiconductor and the application of radical particles may also be performed alternately.

There are argon radicals, nitrogen radicals or the like as the radical particles other than hydrogen radicals, but chlorine and fluorine that become the etching gas of a compound semiconductor are not included.

Besides, it is important in the present invention to apply radical particles that do not become an etchant to the mask and the surface of the compound semiconductor layer when selective growth is made on the compound semiconductor layer with an insulating film pattern as a mask, and it is not required to manufacture a semiconductor device in a low-pressure atmosphere using the apparatus shown in FIG. 1.

(The fourth embodiment)

In the transistor of the embodiment described above, a GaAs buffer layer is formed on a GaAs substrate. As another method of improving crystallinity, an inclined substrate with a plane inclined from a (100) plane toward a (110) plane by several degrees as a top plane is adopted sometimes, and a very thin compound semiconductor layer is interposed on the buffer layer thereof sometimes. When such a structure is adopted, however, such a problem as described hereunder is presented.

When a GaAs layer is grown on an InGaAs layer after an InGaP layer or an InGaAs layer is formed by a general method and the state of the surface of the GaAs layer is observed with an atomic force microscope (AFM), the present inventor et al. have found that a plurality of holes have been produced in an n-GaAs layer 25. Next, an example thereof will be described.

A structure of a compound semiconductor layer adopted when both an enhancement type (E mode) HEMT and a depletion type (D mode) HEMT are formed on one GaAs substrate as a transistor will be described with reference to FIG. 7A.

Figure 7A:
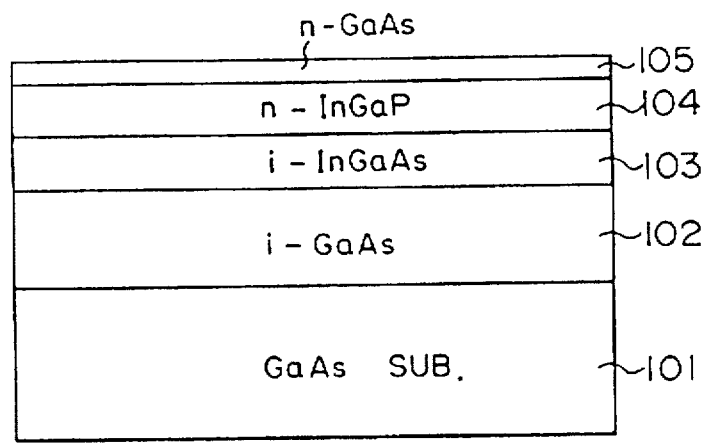
FIG. 7A is a sectional view showing an example of a multilayer structure of a compound semiconductor constituting a compound semiconductor device.

In FIG. 7A, an i-GaAs buffer layer 102, an i-InGaAs layer 103, an n-InGaP layer 104 and an n-GaAs layer 105 are formed on a GaAs substrate 101. The GaAs substrate 101 has an inclined plane 2.5 degrees off from a (100) plane toward a (110) plane. The i-GaAs buffer layer 102 for improving crystalline defects of the substrate is in existence on the inclined plane. The i-InGaAs layer 103 acts as an electron travelling layer of the D mode HEMT and the E mode HEMT, and the n-InGaP layer 104 acts as an electron supply layer of the D mode HEMT and the E mode HEMT.

The n-InGaP layer 104 acting as the electron supply layer is restricted as described in the following since it adjusts a threshold value of the gate voltage of the E mode HEMT.

Figure 7B:
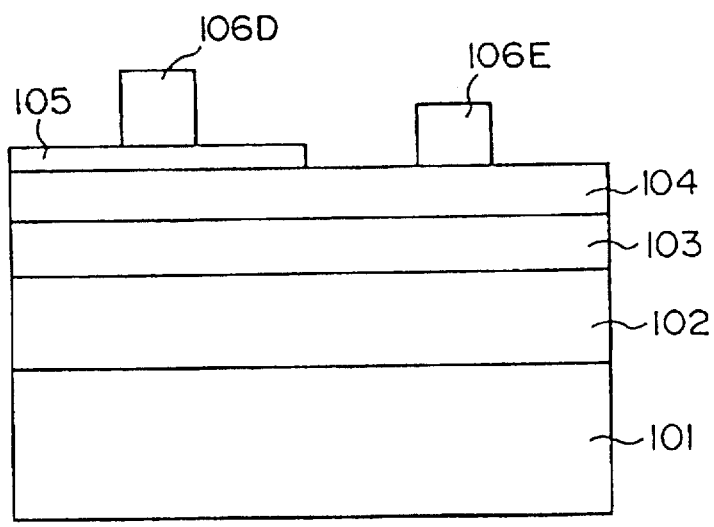
FIG. 7B is a sectional view showing a connection state of a gate electrode of a complementary HEMT formed by using the multilayer structure of the compound semiconductor.

As shown in FIG. 7B, an E mode gate electrode 106E comes into Schottky contact with the surface of the n-InGaP layer 104. In order to form an E mode HEMT, it is required to have a depletion layer extended from the gate electrode 106D to the i-InGaAs layer 103 (the electron travelling layer) in a state that the gate voltage is not applied to the gate electrode 106D. For that purpose, it is required to make the film thickness of the n-InGaP layer 104 thinner than 30 nm.

On the other hand, the D mode gate electrode 106D comes into Schottky contact with the surface of the n-GaAs layer 105 formed on the n-InGaP layer 104. When the gate electrode 106D is brought into contact with the n-GaAs layer 105, the spread of the depletion layer becomes smaller, and the depletion layer is not extended up to the i-InGaAs layer 103 (the electron travelling layer) in a state that no gate voltage is applied. When the gate voltage is applied to the gate electrode 106D, however, it is required to make the thickness of the n-GaAs layer 105 thinner than 4 nm because it is required to make the depletion layer extended up to the electron travelling layer.

In a compound semiconductor layer forming a complementary HEMT as described above, the n-InGaP layer 104 and the i-InGaAs layer 103 having different energy band gaps are adopted. The InGaAs layer having a lattice constant that does not match with that of the GaAs substrate has a higher saturation velocity of electrons, and also has a larger energy band gap as compared with the InGaAs layer. A compression strain and a tensile strain are produced in the GaAs layer and the InGaP layer due to the difference in the lattice constant.

The GaAs layer such as described above is grown by MOVPE. A decompressed barrel furnace was used as a growth furnace, trimethylgallium (TMG), triethylgallium (TEG) or trimethylindium (TMI) was used as a III group material, and arsine ($AsH_3$) was used as a V group material. Further, the pressure in the decompressed barrel furnace was set to 50 Torr and the growth temperature was set to 660° C. when the compound semiconductor layer was grown. Furthermore, a three-inch sized substrate was used as the GaAs substrate 101, and a compound semiconductor layer was grown on the top plane 2.5 degrees off from a (100) plane.

Figure 8:
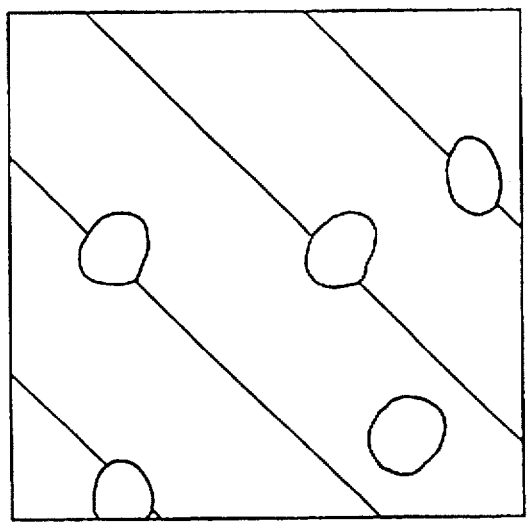
FIG. 8 is a plan view showing a top surface of a GaAs layer formed by a conventional method, the plan view being drawn on the basis of an atomic force microscope (AFM) photograph.

When the n-GaAs layer 105 was formed after the i-InGaAs layer 103 and the n-InGaP layer 104 were formed under such conditions, and the surface of the n-GaAs layer 105 was observed with an AFM, it was found that holes were in existence on the surface of the n-GaAs layer 105 as shown in FIG. 8. FIG. 8 is obtained by drawing based on a photograph taken with an AFM. According to the photograph taken with an AFM, it was observed that a plurality of holes each in the size of approximately $3.4 \times 10^8/cm^2$ were opened in the surface of the n-GaAs layer 105.

When the n-GaAs layer 105 was grown on the i-InGaAs layer 103 without having the n-InGaP layer 104 interposed therebetween for trial, no hole was observed in the surface of the n-GaAs layer 105. Further, even when the state of the boundary between the n-InGaP layer 104 and the n-GaAs layer 105 is changed by varying their growth conditions, holes still existed.

It is conceivable as the reason for the above that a strain is produced partially, in the i-InGaAs layer 103 because the lattice constant of InGaAs and the lattice constant of GaAs and InGaP are different largely, phosphorus (V group) at the strain portion comes off irrespectively of the growth conditions, and a microscopic area where changeover of composition from the n-InGaP layer 104 to the n-GaAs layer 105 is inferior is generated. When the thickness of the n-InGaP layer 104 is made thicker to approximately 100 nm, no hole is opened in the surface of the n-GaAs layer 105. This is because of such a reason that the boundary between the n-InGaP layer 104 and the n-GaAs layer 105 is separated from the i-InGaAs layer 103 having a strain.

Another reason that holes are in existence is as follows. Since an inclined substrate is adopted as the GaAs substrate 101, step bunching is formed in the i-InGaAs layer 103, a natural super lattice of In, Ga and P becomes liable to be produced in the n-InGaP layer 104, and gallium (Ga) becomes more difficult to attach onto the n-InGaP layer 104, thus GaAs grows into an island shape. The island is expanded to become the GaAs layer as GaAs gets thicker, but holes are in existence during the process of forming the GaAs layer. It is observed that the holes produced in the n-GaAs layer 105 are filled up when the layer is grown thick to show a layer thickness of 20 nm or more.

Since it is required to make the film thickness of the n-InGaP layer 104 thin as described above in order to form an InGaP/InGaAs HEMT, generation of holes in the surface of the n-GaAs layer 105 is unavoidable. When an etching stopper layer (not illustrated) composed of InGaP having a large difference in the etching rate is formed on the n-GaAs layer 105 where such holes are formed, InGaP gets into the holes in the n-GaAs layer 105. Therefore, when the etching stopper layer is removed by etching, the n-InGaP layer 104 (the electron supply layer) under these holes is also etched because the etching rate of InGaP is very large. Such an etching stopper layer is formed for the purpose of preventing etching of the n-GaAs layer 105 when patterning is applied to a GaAs layer (not illustrated) that becomes a contact layer of a HEMT.

When a D mode gate electrode 106D is formed on the surface of the n-GaAs layer 105 having holes, it happens sometimes that this gate electrode 106D comes into contact with the n-InGaP layer 104 through the holes. When the holes do not penetrate through the n-GaAs layer 105, but are formed into recessed portions, a D mode characteristic and an E mode characteristic exist mixedly, thus generating a phenomenon that the threshold voltage is shifted if a gate electrode is formed on the recessed portions.

Further, it is observed that the holes produced in the n-GaAs layer 105 are filled up when this n-GaAs layer 105 is grown thick in a thickness of 20 nm or more. It is conceivable that there is the n-InGaP layer 104 that is the electron supply layer under the holes in the n-GaAs layer 105, and the surface thereof is distorted partially and formed into InGaAsP, thus making it more difficult for GaAs to grow.

It is conceivable that GaAs grows from side walls of the holes in the holes, but the orientation of the side wall of the hole is (311) plane or the like, where the growth rate of GaAs is extremely low. Thus, a long period of time is required until the holes are filled up. As a result, when the n-GaAs layer 105 that is a cap layer is made thicker, the holes are filled up.

However, since it is required to control the thickness of the n-GaAs layer 105 that is a cap layer to approximately 5 nm because of the reasons described above, it is unavoidable to generate the holes.

Thus, a following method was adopted in order to prevent generation of the holes. The method is described as a fourth embodiment.

An InGaP layer and an InGaAs layer for manufacturing an InGaP/InGaAs HEMT of the present embodiment were grown by MOVPE.

Then, a decompressed barrel furnace was used as a growth furnace, trimethylgallium (TMG), triethylgallium (TEG) or trimethylindium (TMI) was used as a III group material, and arsine ($AsH_3$) was used as a V group material.

Further, the pressure was set to 50 Torr and the growth temperature was set to 660° C. at time of crystal growth. Furthermore, a 3-inch substrate was used as the GaAs substrate 101, and a compound semiconductor layer was grown on the top plane thereof 2.5 degrees off from a (100) plane. The surface of the n-GaAs layer in the uppermost layer was evaluated with an AFM.

Figure 9:
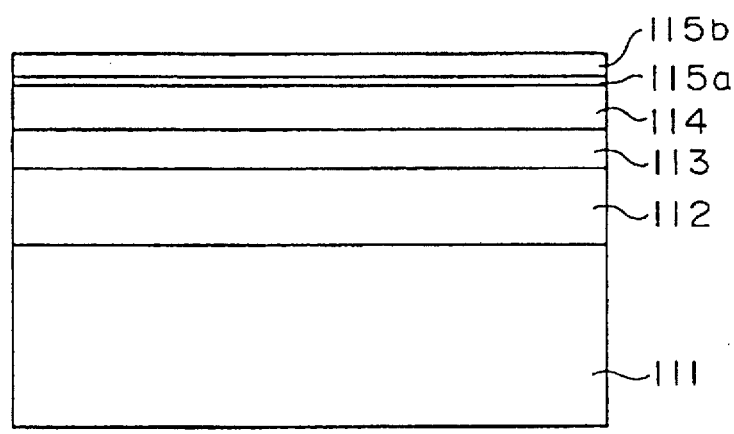
FIG. 9 is a sectional view showing an example of a multilayer structure of a compound semiconductor formed according to a fourth embodiment of the present invention.

A structural view showing an InGaP/InGaAs crystal structure is formed under such conditions as shown in FIG. 9.

On the top plane of a GaAs substrate 111 2.5 degrees off from the (100) plane, an i-GaAs layer 112 that becomes a buffer layer, an i-InGaAs layer 113 that becomes a channel layer, an n-InGaP layer 114 that becomes an electron supply layer, and a first and a second n-GaAs layers 115a and 115b that become cap layers are grown one after another. The thickness of the n-InGaP layer 114 is thinner than 30 nm.

Further, when the cap layers were grown, the first n-GaAs layer 115a was grown thinner than 30 atomic layers under the above-described conditions and the growth was interrupted once thereafter, the temperature was raised by 50° C. higher than the above-mentioned growth temperature, the flow rate of $AsH_3$ was increased twice as high as that at time of growth, and the arsenic pressure was increased, thus applying annealing for 10 minutes Thereafter, the second n-GaAs layer 115b was grown again under the above-mentioned growth conditions, and the total film thickness of the first and the second n-GaAs layers 115a and 115b was made to be 5 nm.

Figure 10:
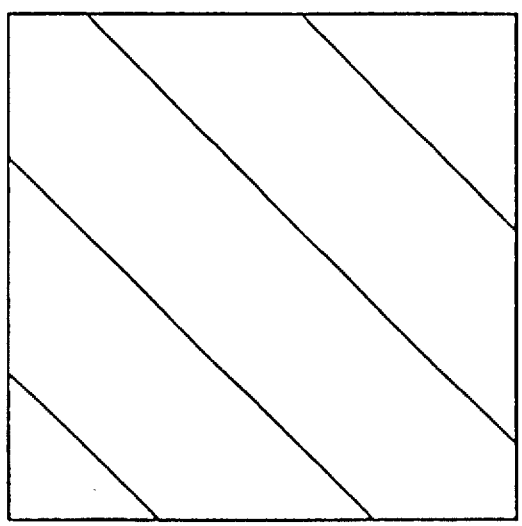
FIG. 10 is a plan view showing a top surface of GaAs layer formed according to the fourth embodiment of the present invention, the plan view being drawn on basis of an AFM photograph.

According to the present embodiment, the holes such as shown in FIG. 8 were not in existence in the surface of the second n-GaAs layer 115b as shown FIG. 10.

Besides, the effect became more conspicuous by increasing the temperature and the arsenic pressure at time of annealing temporarily in the course of the growth of the GaAs layer (preferably in the thickness of 30 atomic layers or less), and the holes in the surface of the second n-GaAs layer 115b were produced when the temperature was lower than that at time of the growth of GaAs or when the flow rate of $AsH_3$ was reduced lower than that at time of growth. Further, even when the flow rate of $AsH_3$ is set equal to the condition at time of growth, the effect is conspicuous when annealing temperature is set higher than that at time of growth.

Besides, phosphine ($PH_3$) containing phosphorus may be introduced in lieu of arsenic at time of annealing.

When an etching stopper layer (not illustrated) composed of InGaP and a GaAs contact layer (not illustrated) were grown on the surface of the second n-GaAs layer 115b formed according to the present embodiment, no problem was presented in point of the characteristic even when the D mode HEMT and the E mode HEMT were produced separately. A source electrode and a drain electrode on both sides of the gate electrode are connected to the contact layer.

In the present embodiment, the compound semiconductor layer including a strain may be formed in a thickness no more than the critical film thickness. As the compound semiconductor layer in this case, there are InGaAsP, InGaAs, GaAsP, GaP, InAs, GaAsSb, InGaAsSb, GaSb, InSb or the like.

Further, when a compound semiconductor layer containing phosphorus like InGaP is in existence in a film thickness of 50 nm or less between a compound semiconductor layer containing a strain and a GaAs layer, desorption of arsenic due to the strain is controlled by suspending the growth temporarily and applying annealing in a process of forming a GaAs layer as described previously.

As described previously, with the photograph taken with an AFM shown in FIG. 10 in the present embodiment, it becomes possible, by observing the surface of the second n-GaAs layer 115b formed on the InGaP/InGaAs crystal layer, to measure indirectly the roughness of the surfaces of the n-InGaP layer 114 and the i-InGaAs layer 113 in the lower layers thereof.

After the first n-GaAs layer 115a and the second n-GaAs layer 115b were formed on the InGaP/InGaAs crystal layer, the present inventor et al. further observed the roughness of the surface of the n-InGaP layer 114 and the roughness of the surface of the i-InGaAs layer 113 directly with an AFM by removing the first and the second n-GaAs layers 115a and 115b by etching or by removing the n-InGaP layer 114 by etching. Besides, a mixed solution of HF, $H_2O_2$ and $H_2O$ is used for removing the first and the second n-GaAs layers 115a and 115b, and HCl is used for removing the n-InGaP layer 114.

As a result of observation, it has been found that the roughness of the surface of the n-InGaP layer 114 or the roughness of the surface of the i-InGaAs layer 113 is extremely different from the roughness of the second n-GaAs layer 115b.

Namely, even when a plurality of holes are generated in the surface of the second n-GaAs layer 115b, no hole has been observed at all sometimes when the surface of the n-InGaP layer 114 or the surface of the i-InGaAs layer 113 thereunder is observed directly.

The reason for the above is that, even when fluctuation of composition or a microscopic defect where a microscopic part of InAs and a microscopic part of GaAs are separated in the i-InGaAs layer 113 has been produced, the fact cannot be observed with an AFM, but no abnormality is recognized at all on the surface of the i-InGaAs layer 113.

Since such fluctuation of composition exerts an influence upon the growth mode of a semiconductor layer formed on the i-InGaAs layer 113, the fluctuation of composition of the i-InGaAs layer 113 is actualized on the surface of the n-InGaP layer 114 or on the surfaces of the first and the second n-GaAs layers 115a and 115b.

Since this i-InGaAs layer 113 is an electron travelling layer, a bad influence is exerted upon the characteristic when there is fluctuation of composition in this layer. Therefore, properly speaking, it is desirable to observe the fluctuation of composition in a stage that the i-InGaAs layer 113 is grown, but the technique for observation has not been established so far.

When such knowledge is utilized, the fluctuation of composition and microscopic defects in a lower layer are presumed by observing the surface of the semiconductor layer in the uppermost layer, i.e., the surface of the second n-GaAs layer 115b. Then, the substrate in which such fluctuation of composition is in existence is excluded from the manufacturing process or used as a wafer for investigating the cause why the fluctuation of composition or the like has been generated. It is possible to judge the fluctuation of composition by a fact that a line showing step bunching becomes no longer a straight line, but is disturbed.

Besides, when the temperature was lowered after the i-InGaAs layer 113 was grown and the surface was observed with the intention of directly observing the roughness of the surface of the i-InGaAs layer 113, only the roughness of an entirely different nature from the roughness of the i-InGaAs layer 113 when the n-InGaP layer 114 and the n-GaAs layer 115 were grown continuously thereon could be observed. Thus, it has been comprehended that the influence exerted upon the practical characteristic of a HEMT cannot be observed in this case.

Now, generally speaking, when an $Al_xIn_yGa_{1-x-y}As$ layer ($0 \leq x \leq 1$, $0 \leq y \leq 1$, $x+y \leq 1$) is grown on a compound semiconductor layer containing phosphorus, holes are liable to be opened in the $Al_xIn_yGa_{1-x-y}As$ layer. In order to prevent the generation of holes, the growth is interrupted and annealing is applied at a temperature equal to or higher than that at time of growth in the atmosphere containing phosphorus or arsenic at a stage when the $Al_xIn_yGa_{1-x-y}As$ layer is grown in a thickness no more than the thickness of 30 atomic layers, and annealing is terminated thereafter and the growth of the $Al_xIn_yGa_{1-x-y}As$ layer is restarted. The pressure of phosphorus or the pressure of arsenic is set equal to or higher than that at time of growing GaAs. No hole is in existence in the $Al_xIn_yGa_{1-x-y}As$ layer thus formed. Such annealing may be adopted a plurality of times during the growth process of the $Al_xIn_yGa_{1-x-y}As$ layer.

It is conceivable that the reason why no hole is formed is such that, by providing energy to gallium or indium on the surface from the outside of the surface of the compound semiconductor layer containing phosphorus, gallium becomes liable to migrate and gallium or indium becomes liable to stick to the compound semiconductor layer containing phosphorus. Further, when the pressure of phosphorus or the pressure of arsenic is increased, the effect of preventing arsenic, gallium or indium from diffusing into a vapor phase from the layer surface can also be expected. Further, since gallium atoms get about so as to minimize surface free energy, unstable holes that make the surface free energy larger are filled up with gallium or the like.

The compound semiconductor layer containing phosphorus does not lattice-match with GaAs, but is formed thin to such an extent that no crystal dislocation is produced when it is formed on a GaAs substrate.

Besides, the compound semiconductor is grown using MOVPE in the above-described explanation, but it may be grown by gas source molecular beam growth or chloride epitaxy.

(The fifth embodiment)

When a compound semiconductor layer is grown by metal organic vapor phase epitaxy (MOVPE) for manufacturing a compound semiconductor device, a compound semiconductor substrate having a plane of orientation slightly off from a (100) plane has been heretofore used as the substrate. Further, the off direction has been toward a (110) plane.

When a compound semiconductor substrate off in such a direction is used, a plurality of kink sites are formed, which has been considered to be indispensable for epitaxial growth from the results of chloride epitaxy. Moreover, it has been believed that it is required to make a substrate off in a direction of a (110) plane for improvement of steepness of composition change at a hetero interface and prevention of mixing with oxygen impurity or the like because it is impossible to obtain a high current gain of an AlGaAs HEMT unless an off substrate is not used.

According to experiments by the present inventor et al., it has been confirmed that it is not necessarily appropriate to set a (100) plane off toward a (110) plane. The details thereof will be described hereunder.

Due to a fact that a HEMT using InGaP for the electron supply layer has excellent low noise characteristics, a high current gain is obtainable since the electron supply layer can be formed thin because of the physical property of InGaP, and it is resistant against oxidation since no Al is contained, such a HEMT is attracting attention in recent years.

In such an InGaP HEMT, when InGaP and InGaAs are used for the electron supply layer and the electron travelling layer, respectively, exchange of arsenic and phosphorus is made at the hetero interface where the characteristic of two-dimensional electron gas is determined when an InGaP layer is formed. Since the V group has a high vapor pressure and is liable to drift away from the surface, however, it is more difficult to improve the steepness of the changeover of the V group elements than to control the changeover of the III group elements.

Accordingly, it is difficult to obtain satisfactory characteristics only with knowhow accumulated with respect to the growth of an AlGaAs HEMT, and it is necessary to devise the sequence of gas changeover itself in the growth.

The orientation of a substrate that is one of growth conditions of respective crystal layers of a HEMT using InGaP for the electron supply layer has neither been confirmed whether it may be the same as the case of an AlGaAs HEMT or not.

The electron travelling layer composed of InGaAs includes a strain since the lattice constant does not match with the GaAs layer thereunder and also has a problem that the roughness at the hetero interface is increased. The step bunching produced in a compound semiconductor layer grown on a plane off toward a (110) plane of the GaAs substrate increases the roughness of the hetero interface.

It is conceived that the step bunching of the compound semiconductor layer is liable to be produced when a substrate having an off plane is used, which, however, has not come to be confirmed. The step bunching means a plurality of steps observed on the surface of the compound semiconductor layer, and is produced by irregular growth in a two-dimensional direction.

The present inventor et al. have examined the relationship between the roughness at the hetero interface caused by lattice mismatching between the InGaAs electron travelling layer and the GaAs electron supply layer and the orientation of the growth substrate. As a result, it has been discovered that it is possible to minimize the roughness at the hetero interface and to improve the steepness of composition change by setting the orientation of the growth substrate off toward a (100) just direction or a (111)A plane direction. In particular, the effect becomes conspicuous by setting the off angle no more than 4 degrees.

It is possible to eliminate the steps of the compound semiconductor layer on the substrate or to have only the step on the A plane exposed to the surface by setting the orientation of the substrate in the (100) just direction or the (111)A plane direction, thereby to control penetration of V group elements into the compound semiconductor layer (the epitaxial layer) at time of changing over the V group elements to the minimum.

As a result, the steepness of the changeover between As and P is improved. Further, excessive generation of the step bunching is prevented by setting the plane direction off within 4 degrees.

Figure 11:
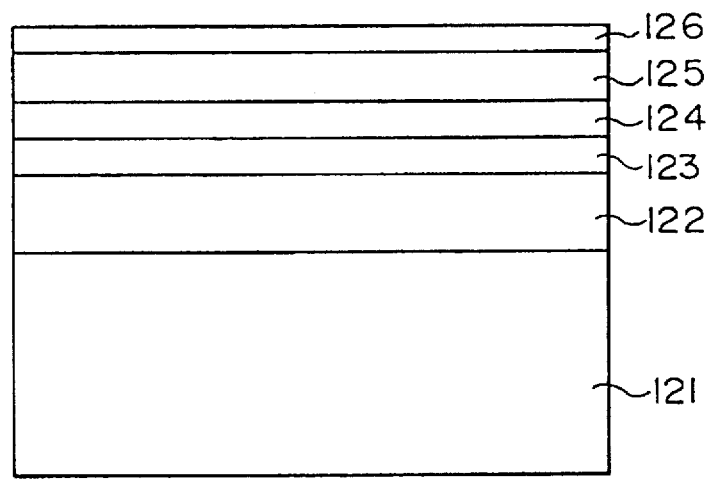
FIG. 11 is a sectional view showing an example of a multilayer structure of a compound semiconductor formed according to a fifth embodiment of the present invention.

FIG. 11 is a structural view of an InGaP/InGaAs crystal laminate according to a second embodiment.

An i-GaAs layer 122 that becomes a buffer layer, an i-InGaAs layer 123 that becomes an electron travelling layer, an i-InGaP layer 124 that becomes an impurity diffusion control layer, an n-InGaP layer 125 that becomes an electron supply layer and an n-GaAs layer 126 that becomes a cap layer are formed successively on a GaAs substrate 121.

When a complementary HEMT is formed with this layer structure, an E mode gate electrode is connected to the i-InGaAs layer 123, and a D mode gate electrode is connected to the n-GaAs layer 126. The source electrode and the drain electrode of the E mode HEMT are connected to a GaAs contact layer through an etching stop layer composed of InGaP not illustrated. Further, the source electrode and the drain electrode of the D mode HEMT are connected to the GaAs contact layer through an etching stopper layer composed of InGaP not illustrated. The E mode HEMT and the D mode HEMT are separated from each other by an insulating layer or a groove.

The crystal structure forming the InGaP/InGaAs HEMT shown in FIG. 11 is grown by MOVPE using a decompressed barrel furnace, and TMG, TEG or TMI is used as the III group material, and AsH$_3$ or PH$_3$ is used as the V group material. The growth pressure is 50 Torr, and the growth temperature is 660° C. Further, a GaAs substrate 3 inches in diameter having various off angles was used as the substrate.

Then, the roughness at the hetero interface when the off angle was varied was evaluated with an AFM.

Figure 12:
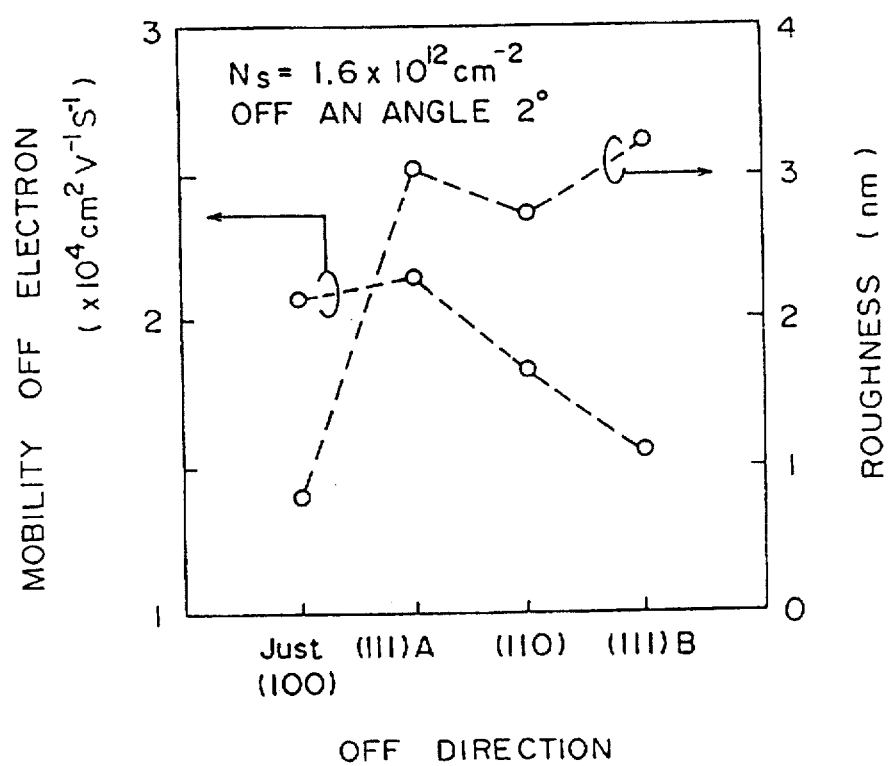
FIG. 12 is a diagram for comparing the mobility of electrons with the surface roughness of a compound semiconductor layer formed on a substrate adopted in the fifth embodiment of the present invention, and for comparing the mobility of electrons with the surface roughness of a compound semiconductor layer formed on a substrate that is not adopted in the fifth embodiment.

FIG. 12 is a relational diagram between the mobility of electron and the roughness when the off direction of the substrate plane is varied.

This diagram shows the relationship between the mobility of electrons in the i-InGaAs layer 123 that becomes an electron travelling layer and the roughness of the surface of the n-GaAs layer 126 that becomes a cap layer when the off direction of the substrate plane is varied. The off angle is all 2 degrees.

Besides, since the roughness of a hetero junction between the i-InGaAs layer 123 and the i-InGaP layer 124 is reflected on the roughness of the surface of the n-GaAs layer 126 that becomes a cap layer, it is possible to evaluate the roughness of the hetero junction indirectly by evaluating the roughness of the surface of the n-GaAs layer 126 that becomes a cap layer.

It is realized from FIG. 12 that the roughness is the minimum and the mobility is high when the off direction of the substrate plane is in the direction of a (100) plane. It is realized that the roughness in several nms is in existence when the substrate plane is off from the (100) plane, but this is the roughness produced by the step bunching. Further, it is also realized that the roughness of the surface of the n-GaAs layer 126 formed on the planes off toward respective planes (111)A, (110) and (111)B from the (100) plane shows almost the same value, but there is a large difference in the mobility of electrons.

As to the mobility of electrons, it is the largest when the plane is set off toward the (111)A plane, the next toward the (110) plane, and the smallest when the plane is set off toward the (111)B plane. With this, it has been comprehended that it is the steepness of composition change at the interface that determines the mobility other than the roughness of the hetero junction, and in particular, that the steepness of the changeover of the V group exerts a big influence upon the characteristics.

Therefore, it has been examined with photoluminescence (PL) whether there is a difference in composition steepness by setting off.

Figure 13:
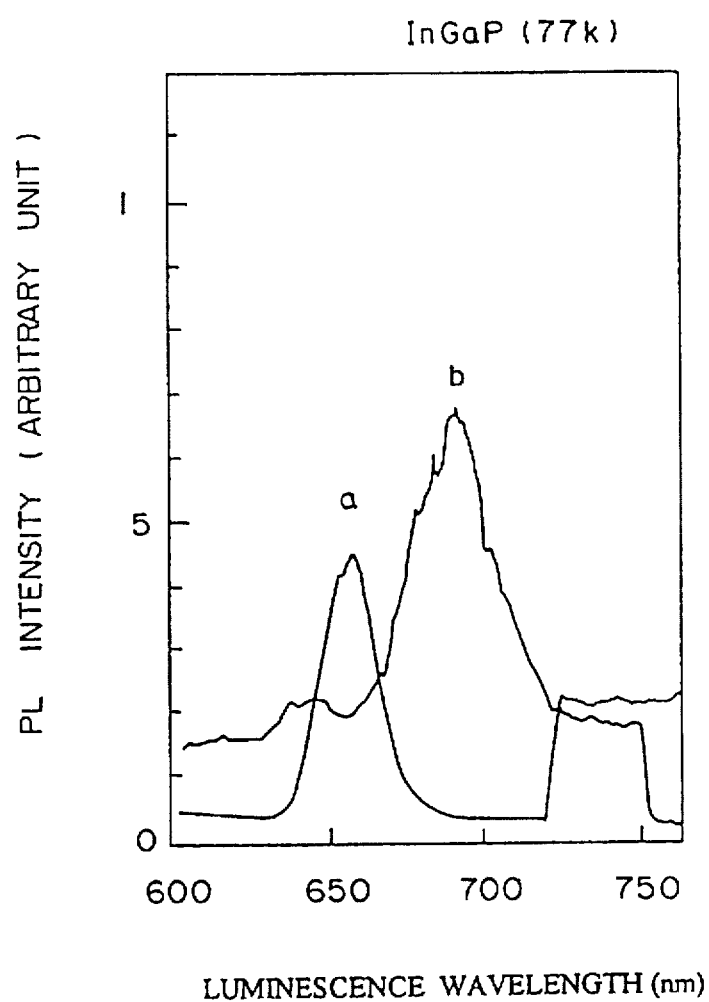
FIG. 13 is a diagram showing the variation of a PL wavelength when AsH₃ is applied to the surface of the InGaP layer and when it is not applied.
Figure 14B:
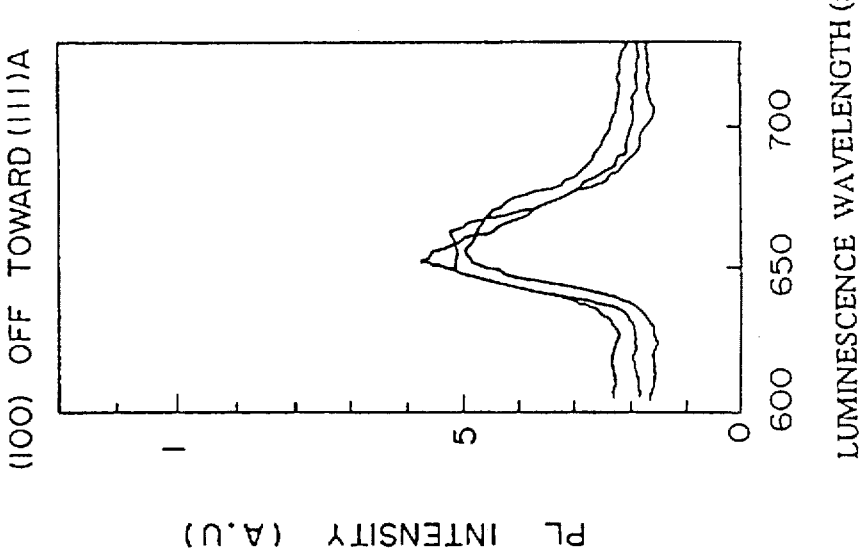
FIG. 14B to FIG. 14D show the relationship between the emission wavelength and the PL spectrum when the main plane of the substrate is inclined from the (100) plane.
Figure 14A:
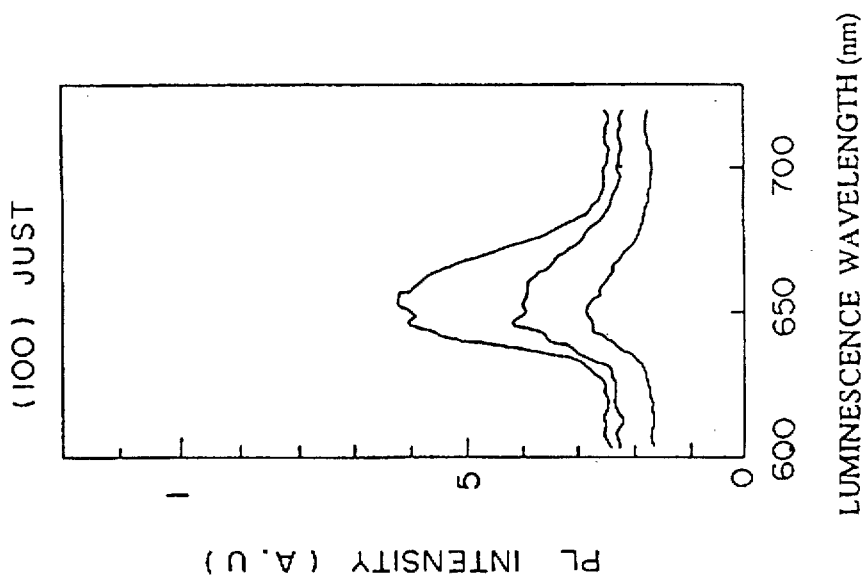
FIG. 14A shows the relationship between the emission wavelength and the PL spectrum when the main plane of the substrate is the (100) plane.
Figure 14D:
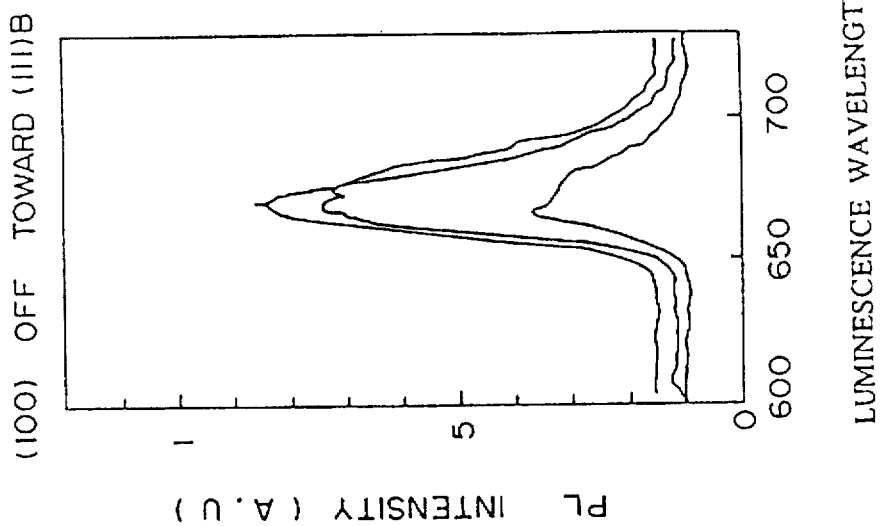
Figure 14C:
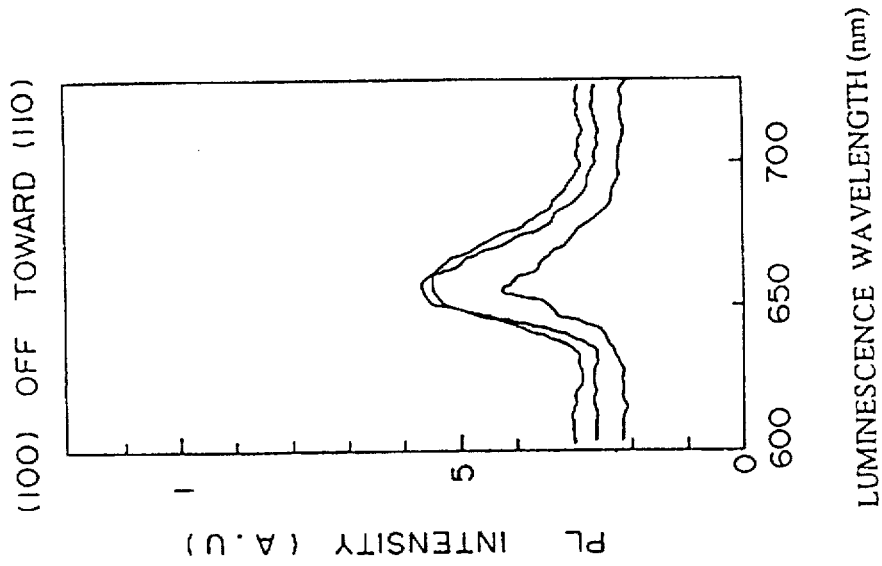

FIG. 13 shows the variation of a PL emission wavelength when AsH$_3$ is applied to the surface of the InGaP layer.

The axis of abscissas in the figure shows the emission wavelength (nm) and the axis of ordinates shows PL intensity (arbitrary unit).

A curve a in the figure shows the PL intensity from the surface of the InGaP layer grown by an ordinary method. A curve b shows the PL intensity from the surface when the InGaP layer is annealed in AsH$_3$ after the InGaP layer is grown. GaAs is not formed on the InGaP layer in this case. The relationship between the emission wavelength and the PL intensity was measured at a temperature of 77 K.

Since arsine is taken into InGaP when AsH$_3$ is applied to the surface of the InGaP layer and the surface is annealed, the center of the emission wavelength is shifted toward the long wavelength side from approximately 665 nm to approximately 690 nm.

Since the shift quantity is in proportion to the taking-in quantity of arsenic, it has been determined to adopt the taking-in quantity for evaluation of the changeover steepness.

FIG. 14A to FIG. 14D show the relationship between the emission wavelength and the PL spectrum when the off direction of the substrate is varied. Three curves drawn in these figures show that PL spectra at three positions on the surface of the InGaP layer are measured.

It is shown from these figures that the center of the emission wavelength is shifted the largest when off is made from the (100) plane toward the (111)B plane. It is realized that the shift quantity of the center of the emission wavelength is small when off is not made from the (100) plane and when off is made toward the (111)A plane.

Accordingly, it may safely be said that the steepness of composition change of a compound semiconductor reaches the best when off is made toward the (100) plane just and the (111)A plane.

From the foregoing, the steepness of composition change is better and the characteristics of the HEMT are improved further when off is made toward the (100) plane just or the (111)A plane than to set off from the (100) plane toward the (110) plane that has been heretofore adopted.

Further, when the off angle is set to 4 degrees or more, the formation of the (311) plane has priority due to the stability of surface free energy of the InGaAs layer on the InGaP layer, thus deteriorating the roughness at the hetero interface. Thus, it has been realized that it is desirable to set the off angle from the (100) plane to 4 degrees or less.

Besides, the fourth embodiment described above has showed a method of manufacturing a compound semiconductor device in which a thin compound semiconductor layer the lattice constant of which does not match is grown on a GaAs substrate, the growth is interrupted at a stage where GaAs has grown in a film thickness no more than 30 atomic layers when a GaAs layer is grown thereon, and GaAs is grown again after annealing in an arsenic atmosphere. The fifth embodiment related to a method of growing a compound semiconductor on a substrate composed of a compound semiconductor and in which the orientation is inclined within 4 degrees toward the (100) plane or from the (100) plane toward the (111)A plane. A compound semiconductor device having excellent characteristics is realized by using the characteristics of these two embodiments in combination.

A case of manufacturing a HEMT has been described in respective embodiments described above, but the present invention is also applicable to a field effect semiconductor device other than the HEMT.

What is claimed is:

1. A method of manufacturing a semiconductor device comprising the steps of:

growing a compound semiconductor layer in which a lattice constant does not match with that of a substrate and having a thickness that crystal dislocation is controlled on said substrate;

growing $Al_xIn_yGa_{1-x-y}As$ ($0 \leq x \leq 1$, $0 \leq y \leq 1$, $x+y<1$) on said compound semiconductor layer;

interrupting the growth of said $Al_xIn_yGa_{1-x-y}As$ layer and annealing said $Al_xIn_yGa_{1-x-y}As$ and said compound semiconductor layer in an atmosphere containing any of arsenic and phosphorus at a temperature higher than the growth temperature of said $Al_xIn_yGa_{1-x-y}As$; and restarting the growth of said $Al_xIn_yGa_{1-x-y}As$ after completing said annealing, thereby to form the $Al_xIn_yGa_{1-x-y}As$ layer.

2. The method of manufacturing a semiconductor device according to claim 1, wherein said substrate is a GaAs substrate and said $Al_xIn_yGa_{1-x-y}As$ layer is a GaAs layer.

3. The method of manufacturing a semiconductor device according to claim 1, wherein said compound semiconductor layer is InGaAsP, InGaAs, GaAsP, GaP, InAs, GaAsSb, InGaAsSb, GaSb or InSb having a critical film thickness or less.

4. The method of manufacturing a semiconductor device according to claim 1, wherein the growth of said $Al_xIn_yGa_{1-x-y}As$ layer is interrupted when said GaAs layer has a film thickness of 2 atomic layers or less.

5. The method of manufacturing a semiconductor device according to claim 1, wherein the final film thickness of said $Al_xIn_yGa_{1-x-y}As$ layer is thinner than 20 nm.

6. The method of manufacturing a semiconductor device according to claim 1, wherein interruption of the growth of said $Al_xIn_yGa_{1-x-y}As$ layer is made once or a plurality of times until the growth of the $Al_xIn_yGa_{1-x-y}As$ layer is completed.

7. The method of manufacturing a semiconductor device according to claim 1, wherein arsenic pressure or phosphorus pressure in said atmosphere containing arsenic or phosphorus is higher than the pressure of arsenic used when said GaAs is grown.

8. The method of manufacturing a semiconductor device according to claim 1, wherein at least one of said compound semiconductor layer and said $Al_xIn_yGa_{1-x-y}As$ layer is grown by organic metal epitaxy, gas source molecular beam growth or chloride epitaxy.

9. The method of manufacturing a semiconductor device according to claim 1, wherein said substrate has a plane to be grown that is inclined from a (100) plane.

* * * * *